(12) United States Patent
Gritters

(10) Patent No.: US 7,688,085 B2
(45) Date of Patent: Mar. 30, 2010

(54) CONTACTOR HAVING A GLOBAL SPRING STRUCTURE AND METHODS OF MAKING AND USING THE CONTACTOR

(75) Inventor: John K. Gritters, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 248 days.

(21) Appl. No.: 11/423,878

(22) Filed: Jun. 13, 2006

(65) Prior Publication Data

US 2007/0296433 A1 Dec. 27, 2007

(51) Int. Cl.
*G01R 31/02* (2006.01)
(52) U.S. Cl. .................... 324/754; 324/762
(58) Field of Classification Search .......... 324/754, 324/761, 762
See application file for complete search history.

(56) References Cited

U.S. PATENT DOCUMENTS 3,702,439 A * 11/1972 McGahey et al. .......... 324/757
3,810,016 A * 5/1974 Chayka et al. ............. 324/762
6,344,752 B1 * 2/2002 Hagihara et al. ........... 324/754
7,355,421 B2 * 4/2008 Maruyama et al. ......... 324/754
2004/0223309 A1 11/2004 Haemer et al.
2004/0246010 A1 12/2004 Di Stefano

OTHER PUBLICATIONS

Int'l Preliminary Report on Patentability, PCT application PCT/US/2007/069812 (Dec. 31, 2009), 7 pages.
PCT Search Report PCT/US07/69812 (Sep. 8, 2008).

* cited by examiner

*Primary Examiner*—Ha Tran T Nguyen
*Assistant Examiner*—Roberto Velez
(74) *Attorney, Agent, or Firm*—N. Kenneth Burraston

(57) ABSTRACT

In some embodiments of the invention, a probing apparatus can comprise a substrate, a spring structure attached to the substrate, and a plurality of resilient probes attached to the spring structure. Each probe can comprise a contact portion disposed to contact a device. The spring structure can provide a first source of compliance for each of the probes in response to forces on the contact portions of the probes, and each of the probes can individually provide second sources of compliance in response to the forces on the contact portions of the probes.

25 Claims, 25 Drawing Sheets

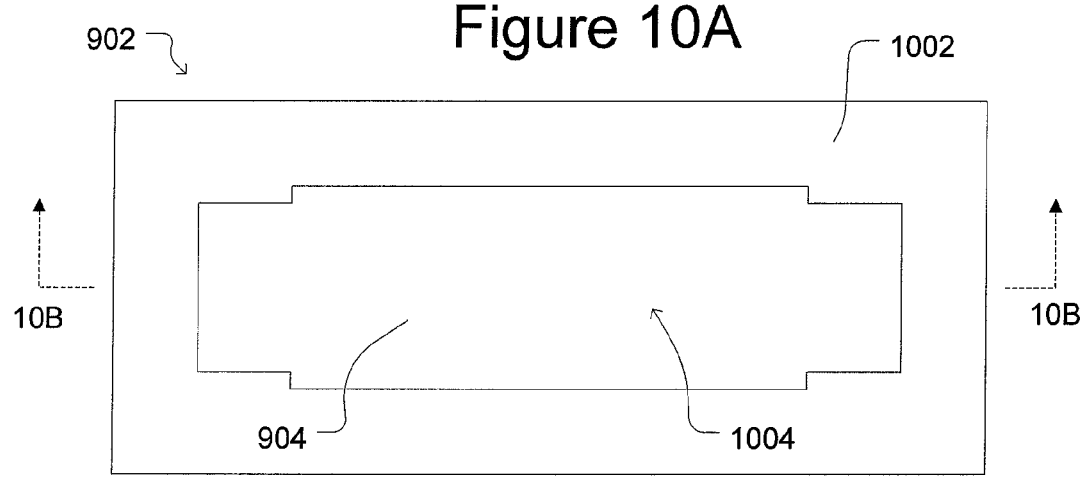
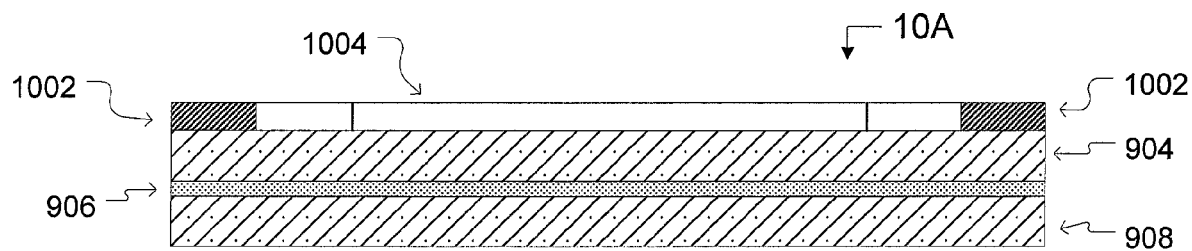

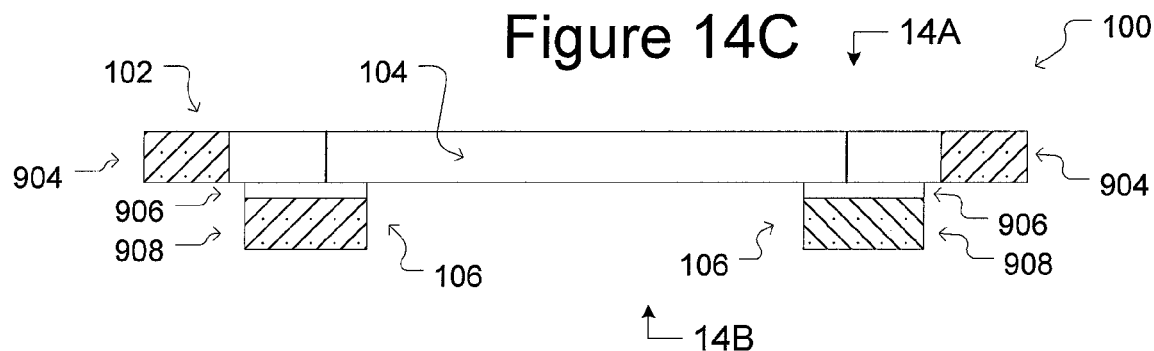
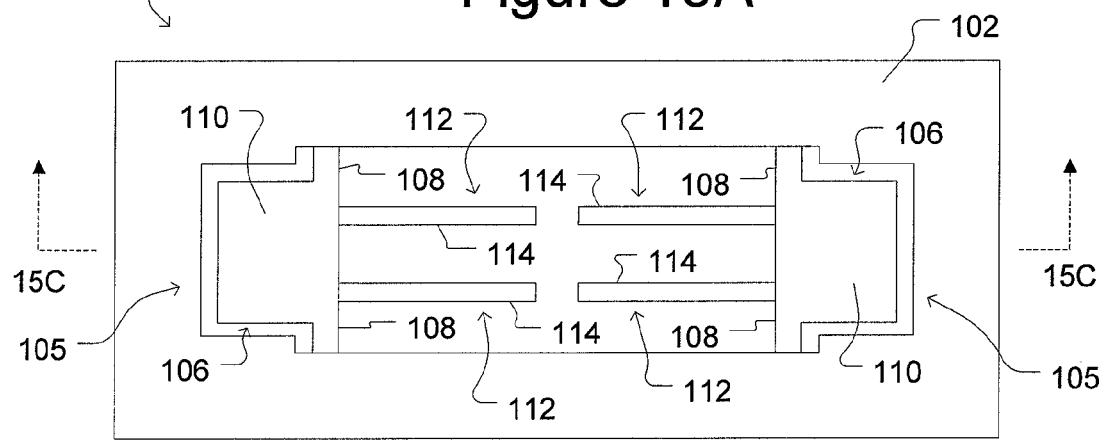

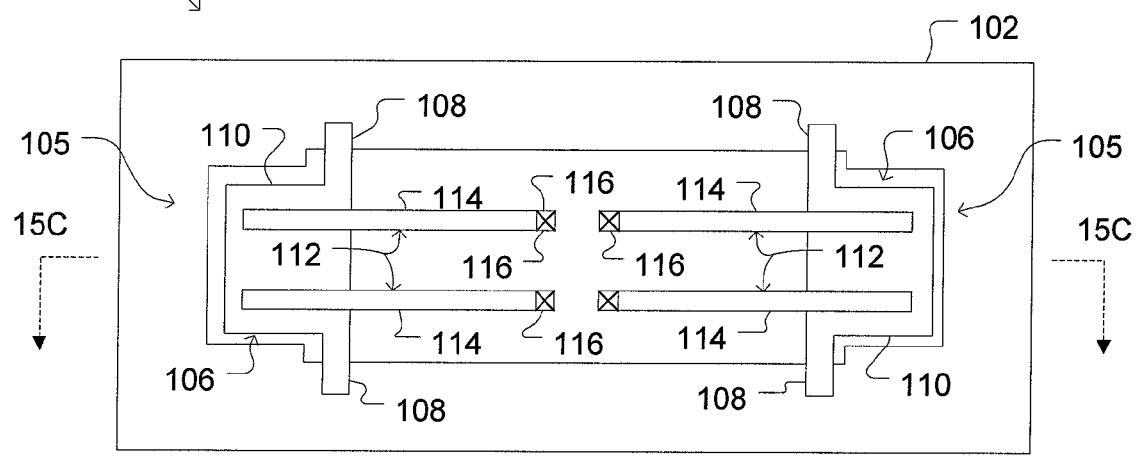
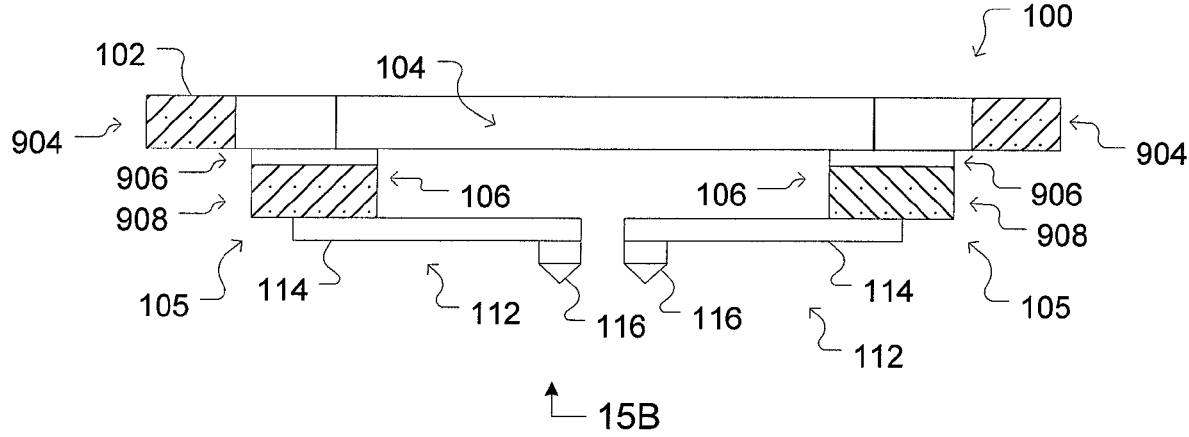

US 7,688,085 B2

CONTACTOR HAVING A GLOBAL SPRING STRUCTURE AND METHODS OF MAKING AND USING THE CONTACTOR

BACKGROUND

There are many applications in which a plurality of relatively small or micro sized probes are used to contact or "probe" an object or device. One such application is testing electronic devices, such as semiconductor dies. In such a testing application, electrically conductive probes contact and make temporary electrical connections with input and/or output terminals of one or more electronic devices. Test data can then be input into the electronic device or devices through the probes and response data generated by the electronic device in response to the test data can be sensed through the probes. The present invention is directed to improvements in probing apparatuses and in methods of making and using probing apparatuses.

SUMMARY

In some embodiments of the invention, a probing apparatus can comprise a substrate, a spring structure attached to the substrate, and a plurality of resilient probes attached to the spring structure. Each probe can comprise a contact portion disposed to contact a device. The spring structure can provide a first source of compliance for each of the probes in response to forces on the contact portions of the probes, and each of the probes can individually provide second sources of compliance in response to the forces on the contact portions of the probes.

DESCRIPTION OF THE DRAWINGS

FIGS. 9-15C illustrate exemplary formation of the global spring structure of FIG. 1 in accordance with the process of FIG. 8.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity or ease of illustration. In addition, as the term "on" is used herein, one object (e.g., a material, a layer, a substrate, etc.) can be "on" another object regardless of whether the one object is directly on the other object or there are one or more intervening objects between the one object and the other object. Also, directions (e.g., above, below, top, bottom, side, etc.), if provided, are relative and provided solely by way of example and for ease of illustration and discussion and not by way of limitation.

Figure 1:
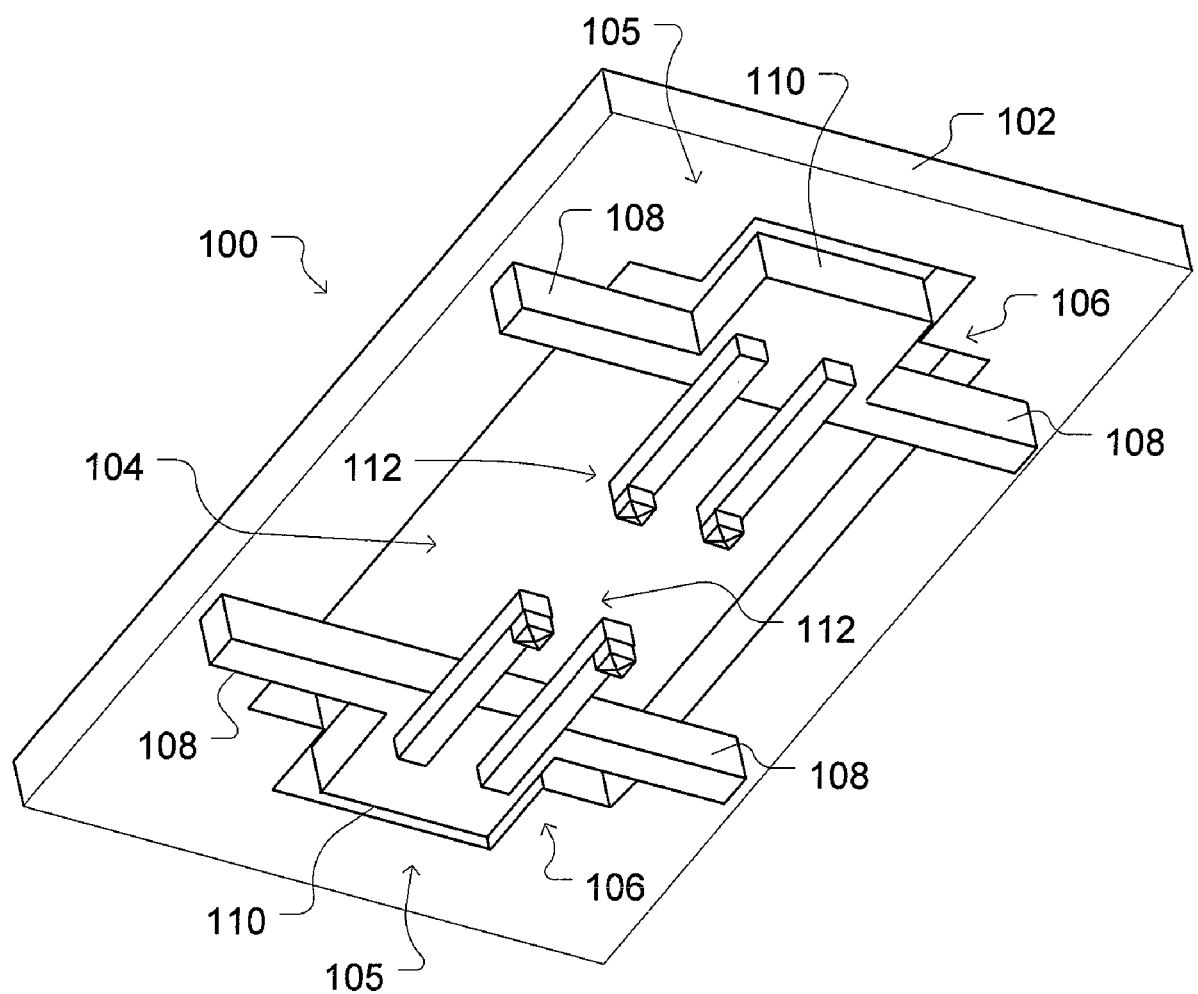
FIG. 1 shows a bottom, perspective view of an exemplary contact structure comprising probes attached to global spring structures according to some embodiments of the invention.
Figure 2:
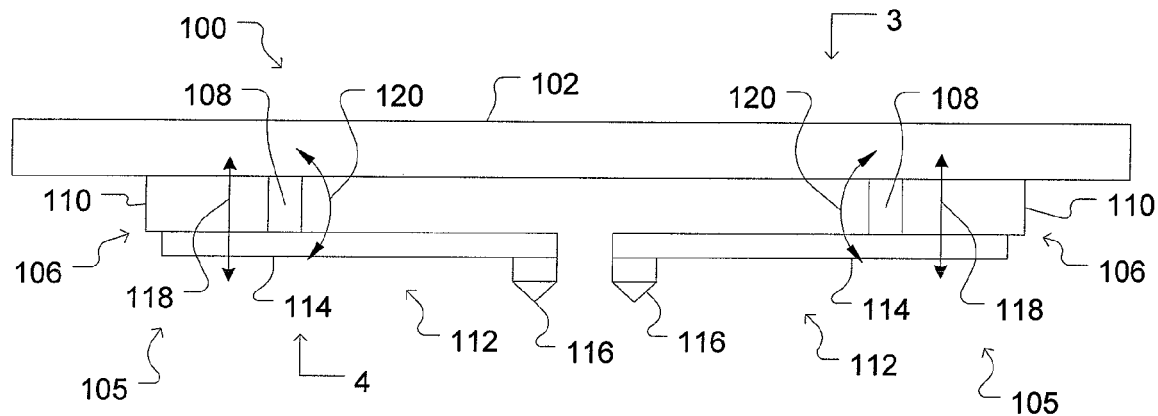
FIG. 2 shows a side view of the contact structure of FIG. 1.
Figure 3:
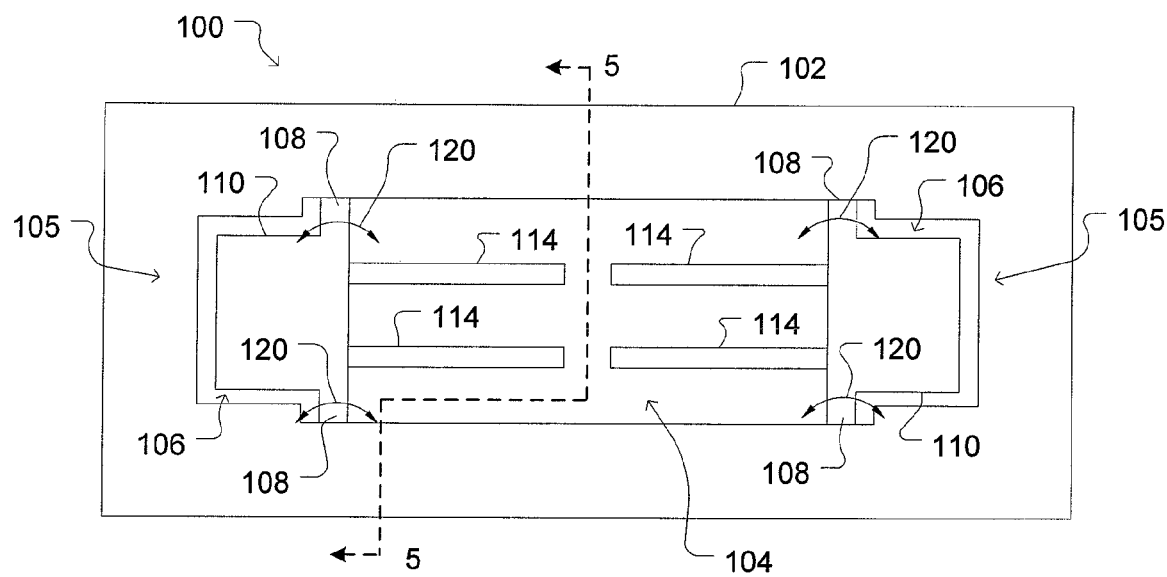
FIG. 3 shows a top view of the contact structure of FIG. 1.
Figure 4:
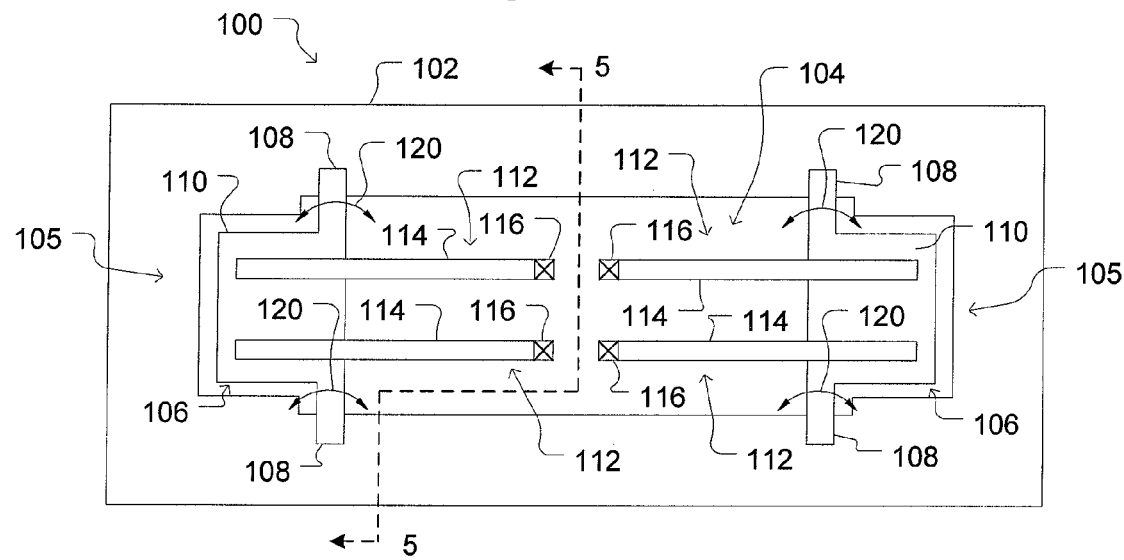
FIG. 4 shows a bottom view of the contact structure of FIG. 1.
Figure 5:
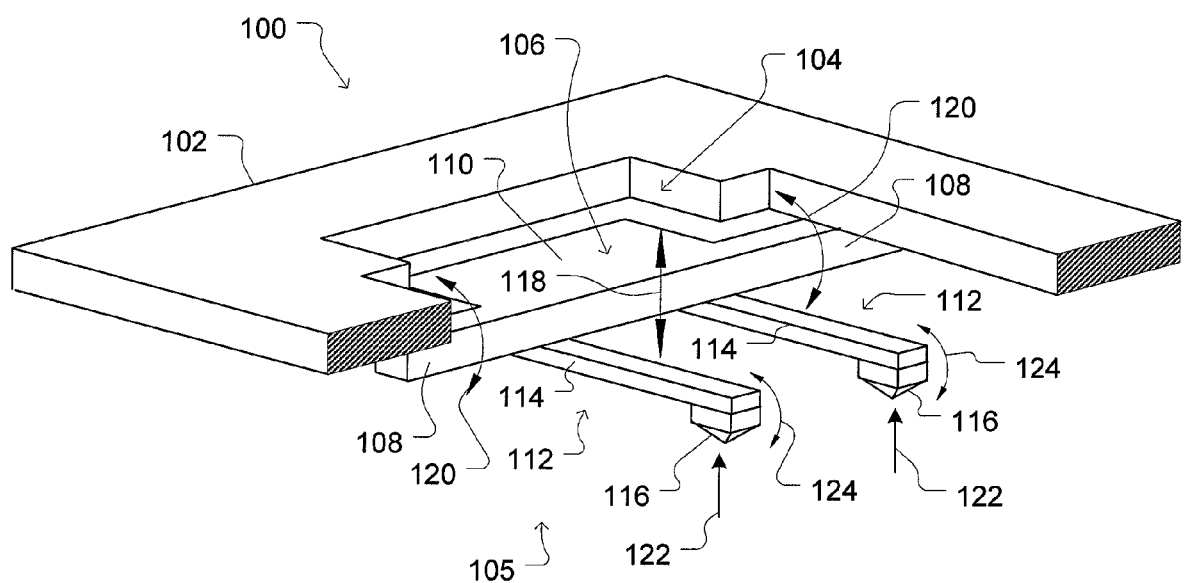
FIG. 5 shows a cross-sectional, top, perspective view of the contact structure of FIG. 1.

FIGS. 1-5 show an exemplary contact structure 100 comprising a plurality of probes 112 mounted on one or more global spring structures 106 according to some embodiments of the invention. FIG. 1 shows a bottom, perspective view, FIG. 2 shows a side view, FIG. 3 shows a top view, FIG. 4 shows a bottom view, and FIG. 5 shows a top perspective, cross-sectional view of the contact structure 100.

As shown in FIGS. 1-5, the contact structure 100 can comprise a tile substrate 102 with an opening 104, and one or more spring probe assemblies 105 can be attached to the tile 102. In FIGS. 1-5, two spring probe assemblies 105 are shown attached to tile 102, but more or fewer spring probe assemblies 105 can be attached to tile 102 in other implementations. As shown, each spring probe assembly 105 can comprise a global spring structures 106 to which a plurality of probes 112 are attached.

As shown in FIGS. 1-5, each global spring structure 106 can include extension arms 108 and a platform 110. Each global spring structure 106 is illustrated in FIGS. 1-5 as having two extension arms 108 and one platform 110, but a global spring structure 106 can have more or fewer extension arms 108 and more platforms 110 in other implementations.

The extension arms 108 can be attached to the tile substrate 102 and thus can be the means by which a global spring structure 106 is attached to the tile substrate 102. The extension arms 108 can be flexible, which can provide each global spring structure 106 certain freedoms of movement. The extension arms 108 can thus be compliant. For example, as shown in FIGS. 2-5, the extension arms 108 can allow the platform 110 to move in a generally translational movement 118 in directions that are generally perpendicular to the tile substrate 102, and the extension arms 108 can also allow the platform 110 to rotate 120 with respect to the tile substrate 102. The extension arms 108 can also be resilient or spring-like such that while one or more forces displace the global spring structure 106 in the translational movement 118 and/or the rotational movement 120, the extension arms 108 exert a counter force or forces in opposition to the force or forces. This counter force or forces can also tend to cause the global spring structure 106 to return to its original shape and position after the force or forces are removed. The extension arms 108 can thus function as springs and can have properties of both a torsion spring (in generating a counter force in response to the rotational movement 120) and a compression spring (in response to the translational movement 118).

As also shown in FIGS. 1-5, one or more probes 112 can be attached to the platforms 110 of each global spring structure 106. In the example shown in FIGS. 1-5, two probes 112 are attached to the platform 110 of each global spring structure 106 but more or fewer probes 112 can be attached to a platform 110 in other implementations. As shown, each probe 112 can comprise a beam 114 and a tip portion 116. As also shown, the beam 114 of each probe 112 can be attached at one end to a platform 110 of a global spring structure 106 such that the other end of the beam 114 extends away in a cantilevered manner from the platform 110, disposing the tip 116 away from the platform 110. The beams 114 can be flexible and, as shown in FIG. 5, can be capable of generally rotational movement 124 with respect to the platform 110 to which the beams 114 are attached in response to forces 122 against the tips 116. The beams 114 can also be resilient such that the beams 114 exert counter forces in opposition to the forces 122 applied to the tips 116. These counter forces can also tend to cause the beams 114 to return to their original shapes and positions after the forces 122 are removed. The beams can thus function as springs and can have properties of a cantilever spring.

Each of the spring probe assemblies 105 shown in FIGS. 1-5 thus can provide two levels of flexibility (or compliance) and spring-like resilience in response to forces 122 applied to the tips 116 of the probes 112 of the spring probe assembly 105. Each global spring structure 106 can provide a global level of flexibility (or compliance) and spring-like resilience in response to the sum of the forces 122 applied to the tips 116 of the probes 112 attached to the global spring structure 106. Each of the beams 114 of the probes 112 of a spring probe assembly 105 can provide a second level of flexibility and spring-like resilience that is an individual response to the individual force 122 applied to its tip 116. That is, each beam 114 can flex, move with a rotational movement 124, and provide a counter force that are individual responses to the particular force 122 applied to the tip 116 of that beam 114.

The spring probe assemblies 105 shown in FIGS. 1-5 are exemplary only, and other configurations can be used. For example, the extension arms 108 and platform 110 can be shaped or configured differently. As another example, the probes 112 can be shaped or configured differently. For example, probes 112 can comprise components other than the exemplary beams 114 and tips 116 shown. Probes 112 can, for example, comprise other components, or the probes 112 can comprise differently shaped or configured beams 114 and/or tips 116. For example, tips 116 can be shaped as pyramids, truncated pyramids, blades, etc.

Figure 6:
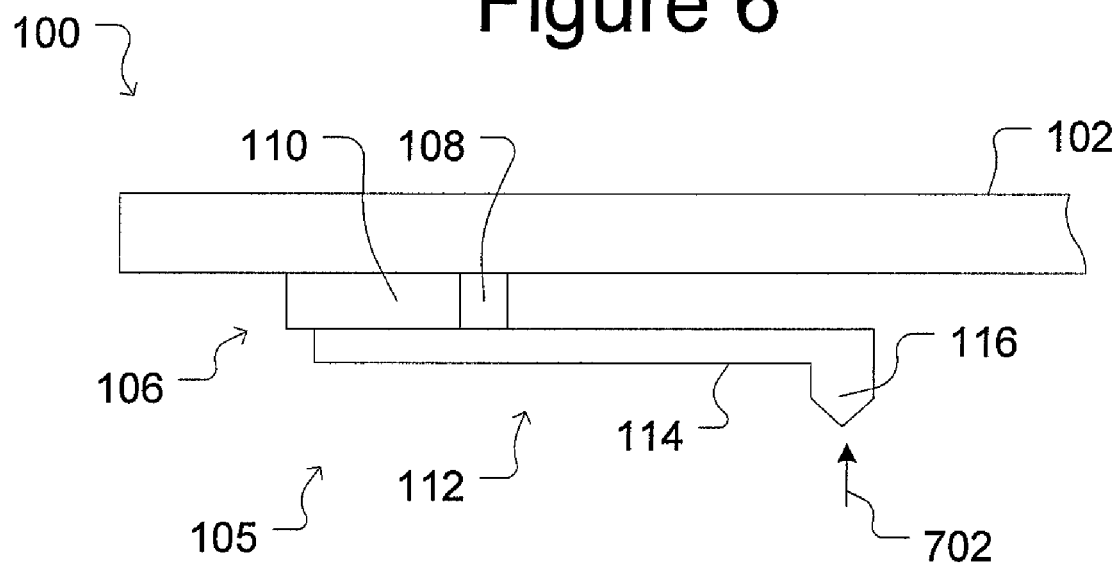
FIGS. 6 and 7 illustrate exemplary responses of a global spring structure and a probe of the contact structure of FIG. 1 to a force according to some embodiments of the invention.
Figure 7:
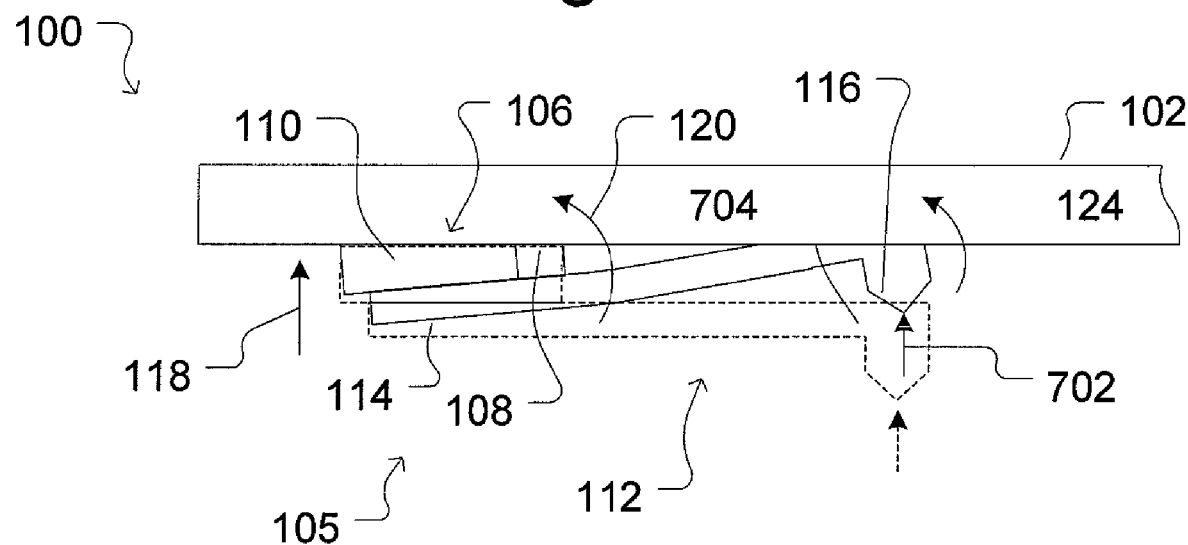

FIGS. 6 and 7 illustrate exemplary responses of a probe 112 and a global spring structure 106 to a force 702 applied to the tip 116 of the probe 112. FIG. 6 illustrates the global spring structure 106 and probe 112 in initial positions prior to application of force 702. As shown in FIG. 7, as the force 702 is applied to the tip 116 of the probe 112, the global spring 106 can respond with a translational movement 118 generally in the direction of the force 702 and a rotational movement 120 about the extension arms 108. This can be the global level of flexibility (or compliance) and spring-like resilience referred to above. The beam 114 of the probe 112 can also respond with a rotational movement 124, which can be the local level of flexibility (or compliance) and spring-like resilience referred to above. These movements—the translational movement 118 and rotational movement 120 of the global spring structure 106 and the rotational movement 124 of the beam 114 of the probe 112—absorb the force 702. In addition, because the global spring structure 106 and the beam 114 can have spring properties, the global spring structure 106 and beam 114 can generate counterforces that oppose the force 702 applied to the tip 116 of the probe 112. As will be discussed below with respect to FIGS. 28 and 29, the foregoing movements and generation of counterforces by the global spring structures 106 and probes 112 can be utilized to generate a wiping action across a terminal of an electronic device to be tested (not shown in FIGS. 6 and 7) as the terminal is pressed against a tip 116 of a probe 112, and the length of the wiping action and the magnitude of counterforces generated by the global spring structure 106 and probe 112 can be tailored to the specific needs of the electronic device and the test system (not shown) being used.

Figure 8:
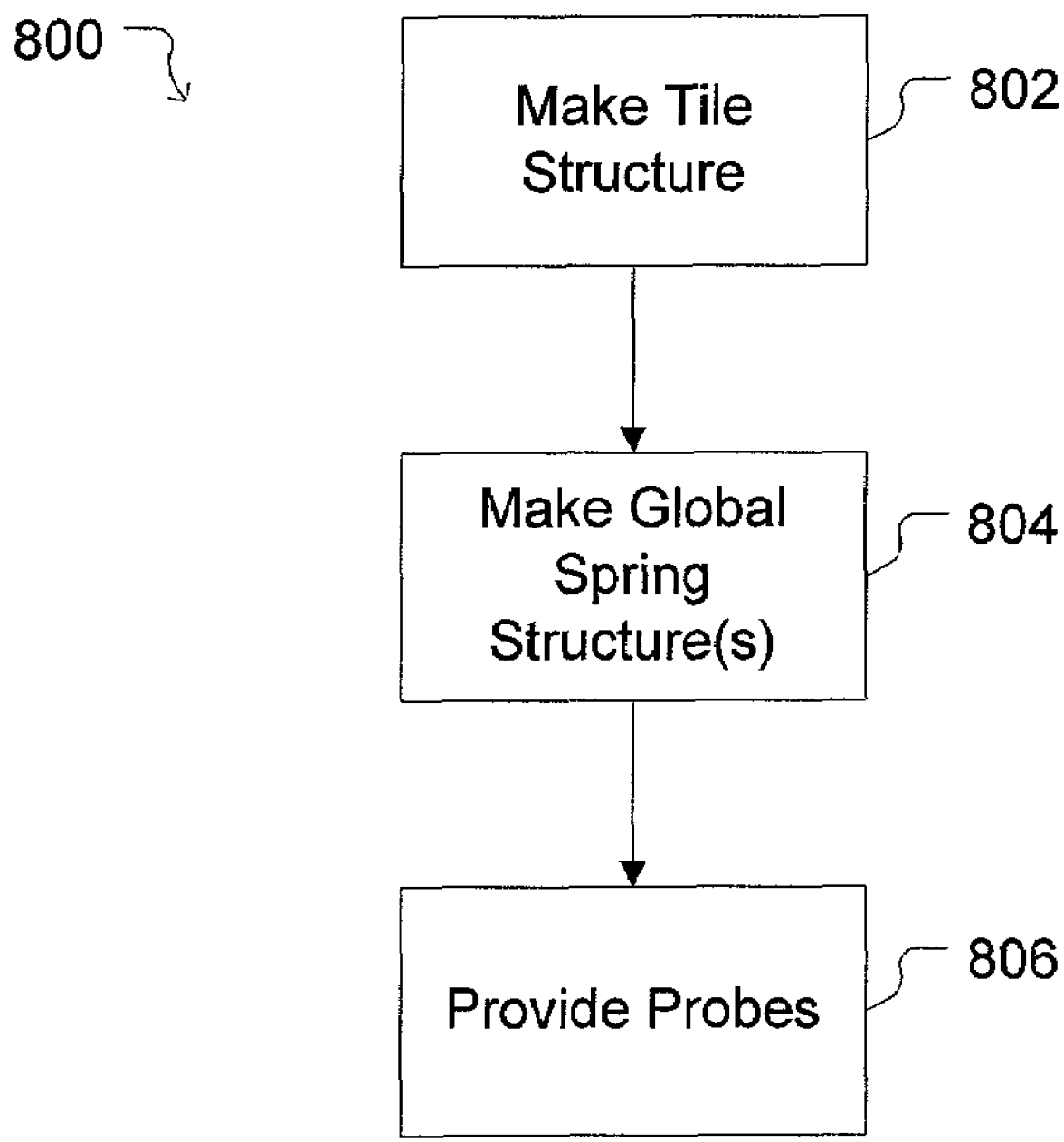
FIG. 8 shows an exemplary process for making a global spring structure like the global spring structure of FIG. 1 according to some embodiments of the invention.

FIG. 8 illustrates an exemplary process 800 for making a contact structure, like the contact structure 100 shown in FIGS. 1-7, according to some embodiments of the invention. Although process 800 can be used to make differently configured contact structures, for ease of discussion and illustration, process 800 is discussed herein in the context of making the contact structure 100 shown in FIGS. 1-7.

Figure 9:
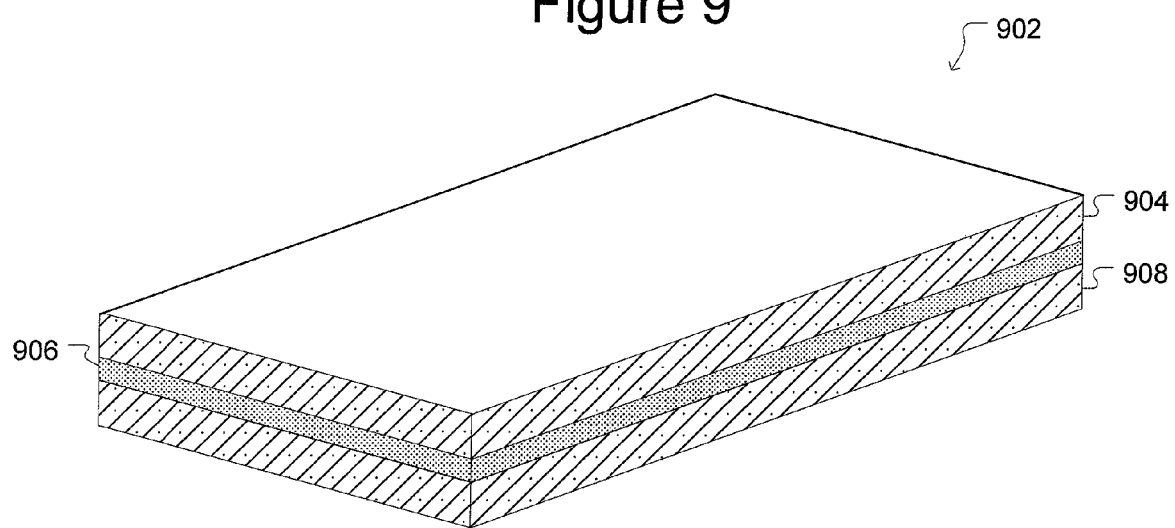

As shown in FIG. 8, the process 800 can include making at 802 the tile 102. FIGS. 9-11B illustrate an exemplary manner of making at 802 the tile 102 according to some embodiments of the invention. As shown in FIG. 9, a multi-layer substrate 902 can be provided. Substrate 902 can comprise a first material layer 904, a separating layer 906, and a second material layer 908. As will be seen, the tile 102 can be etched from the first material layer 904, and the global spring structures 106 can be etched from the second material layer 908. The separating layer 906 can function as an etch stop layer that prevents etching of the first material layer 904 from affecting the second material layer 908 and prevents etching of the second material layer 908 from affecting the first material layer 904. The first material layer 904 can thus comprise any material or materials that are suitable for tile 102 and can be etched. The second material layer 908 can similarly comprise any material or materials that are suitable for global spring structures 106 and can be etched. The separating layer 906 can comprise a material that is not etched or is etched more slowly by the etchant or etchants used to etch the first material layer 904 and the etchant or etchants used to etch the second material layer 908. In some exemplary embodiments, the first material layer 904 and second material layer 908 can comprise silicon, and the separating material 906 can comprise an oxide layer (e.g., silicon dioxide ($SiO_2$)).

As shown in FIGS. 10A and 10B, an etch mask 1002 can be deposited onto the first material layer 904 and patterned to have an opening 1004 that exposes a portion of the first material layer 904. As will be seen, the first material layer 904 can comprise the tile 102, and the opening 1004 in the etch mask 1002 can be used to form the opening 104 in the tile 102 (see FIGS. 1-5). The opening 1004 in the etch mask 1002 can therefore be made in the shape desired for the opening 104 in the tile 102 (see FIGS. 1-5). The etch mask 1002 can be any material or materials that can be deposited onto the first material layer 904 and patterned to have opening 1004 and that will not be etched by, or will be etched more slowly by, the etchant or etchants that are subsequently used to etch the first material layer 904. The material or materials that compose the etch mask 1002 can thus depend on the etching process used to etch the first material layer 904. For example, etch mask 1002 can comprise an oxide layer (e.g., silicon dioxide ($SiO_2$)) formed on the first material layer 904, and opening 1004 can be formed by selectively removing portions of the oxide layer using methods known in the art. As another example, etch mask 1002 can comprise a photoresist material deposited on the first material layer 904 and patterned to form opening 1004 using methods known to those of ordinary skill in the field. As yet another example, etch mask 1002 can comprise a silicon nitride layer (e.g., $SiN_4$).

Figure 11A:
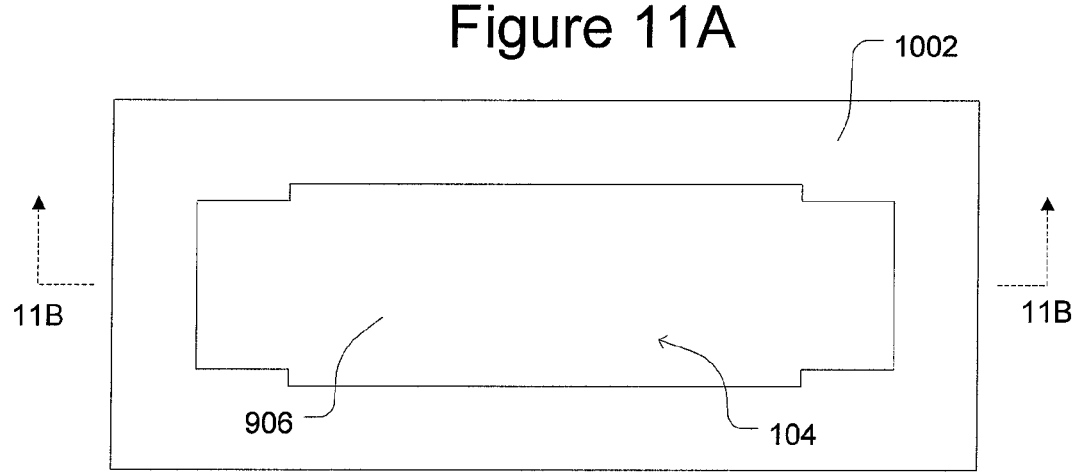
Figure 11B:
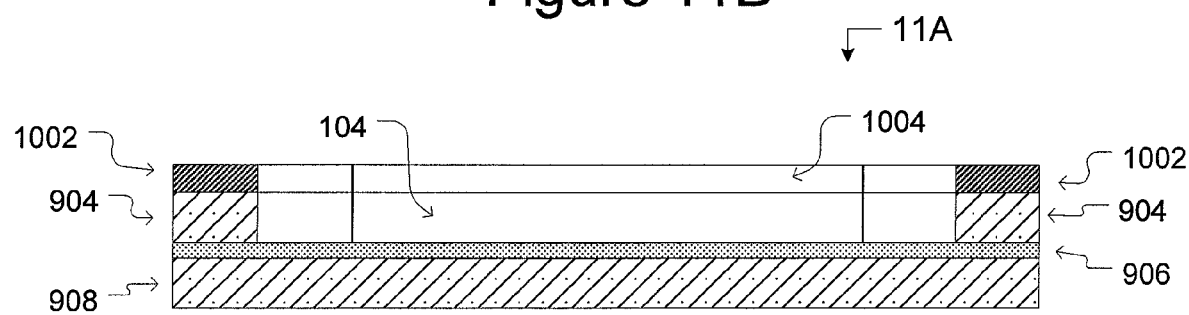

As shown in FIGS. 11A and 11B, portions of the first material layer 904 exposed by opening 1004 in etch mask 1002 can be etched away to the separating layer 906. As discussed above, the separating layer 906 can comprise a material that is not etched by the process used to etch the first material layer 904, and the separating layer 906 can thus function as an etch stop layer. Any etching process and any etchants can be used to etch the first material layer 904. For example, any wet etching process can be used, and the wet etching process can be an isotropic etching process or an anisotropic etching process. Non-limiting examples of suitable etchants include hydrogen fluoride compounds, potassium hydroxide, sodium hydroxide, cesium hydroxide, hydrazine, and ethylenediamine pyrocatechol. Alternatively, a dry etching process can be used, including without limitation reactive ion etching (including deep reactive ion etching), sputter etching, and vapor phase etching.

After etching portions of the first material layer 904 to form opening 104 as shown in FIGS. 11A and 11B, the etch mask 1002 can be removed. The etch mask 1002 can be removed by dissolving the etch mask 1002 in a solvent that does not dissolve or does not appreciably dissolve the first material layer 904 or the second material layer 908. Alternatively, the etch mask 1002 can be removed by applying a dissolving solvent only to the etch mask 1002 without exposing the first material layer 904 or second material layer 908 to appreciable amounts of the solvent. As yet another alternative, the etch mask 1002 can be removed using lasers (e.g., the etch mask 1002 can be ablated). The tile 102 with opening 104 (see FIGS. 1-5) has now been made from the first material layer 904, completing 802 of the process 800 of FIG. 8.

Referring again to FIG. 8, the global spring structures 106 can be made at 804. FIGS. 12A-14C illustrate an exemplary process for making the global spring structures 106 (at 804) according to some embodiments of the invention. As will be seen, in the example shown in FIGS. 12A-14C, the global spring structures 106 can be etched from the second material layer 908 of the multi-layer substrate 902 of FIG. 9.

Figure 12A:
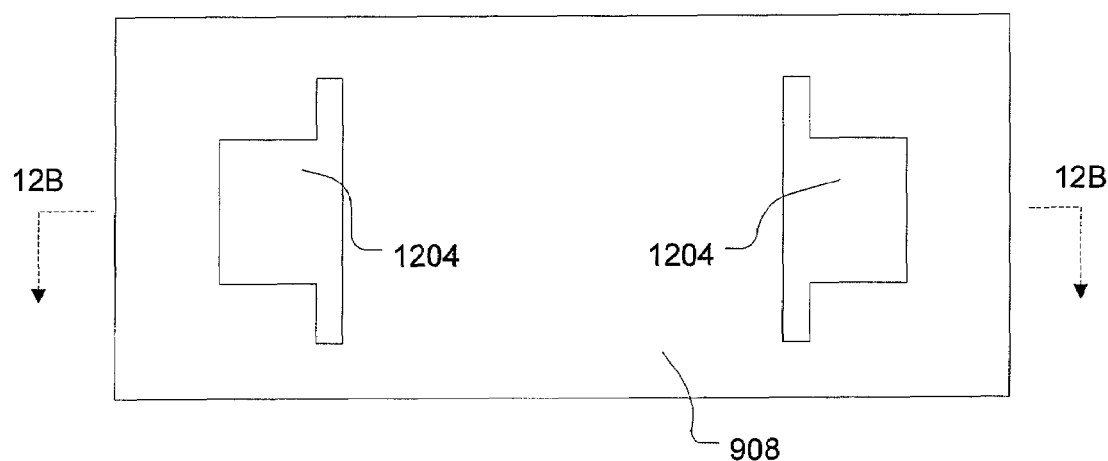
Figure 12B:
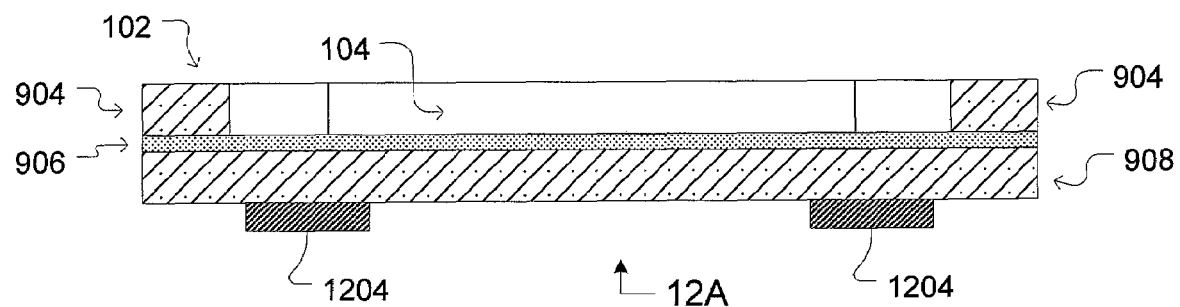
Figure 13A:
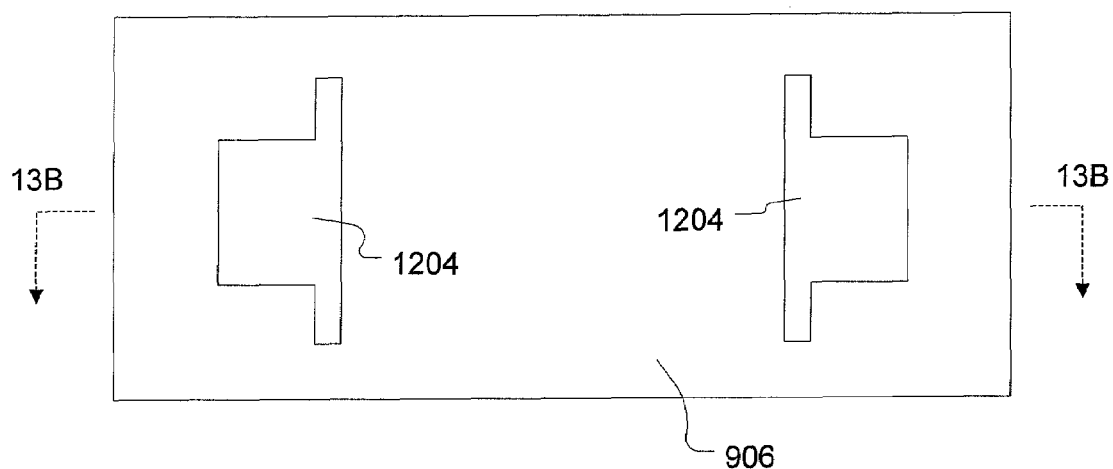
Figure 13B:
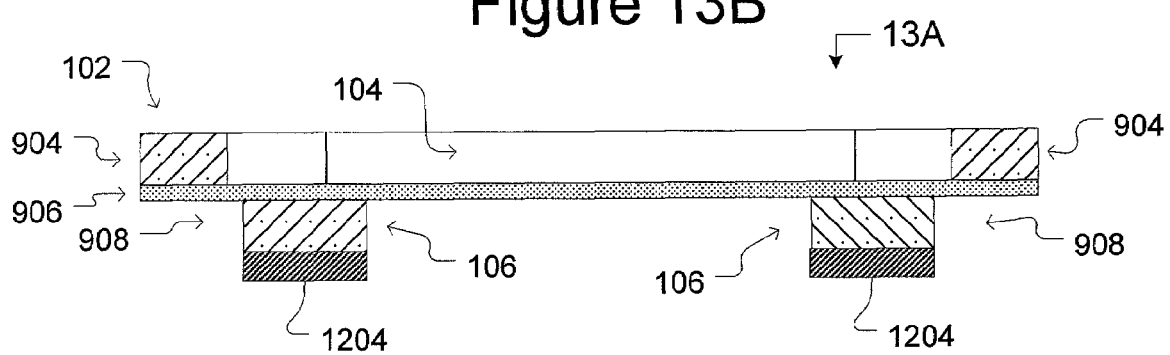

As shown in FIGS. 12A and 12B, an etch mask 1204 patterned to correspond to the desired locations and shapes of the global spring structures 106 can be formed on the second material layer 908. The etch mask 1204 can comprise any of the materials and can be deposited and patterned using any of the methods discussed above with regard to etch mask 1002 of FIGS. 10A-11B. As shown in FIGS. 13A and 13B, portions of the second material layer 908 not covered by etch mask 1204 can be etched away to the separating layer 906, which as discussed above, can function as an etch stop. The second material layer 908 can be etched using any of the processes and etchants discussed above with respect to etching the first material layer 904 to form opening 104.

Figure 14A:
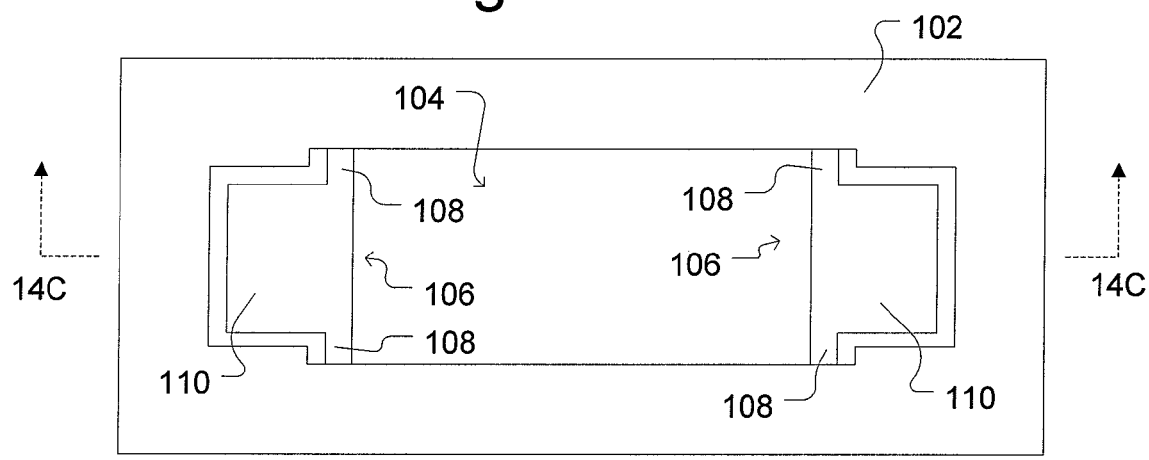
Figure 14B:
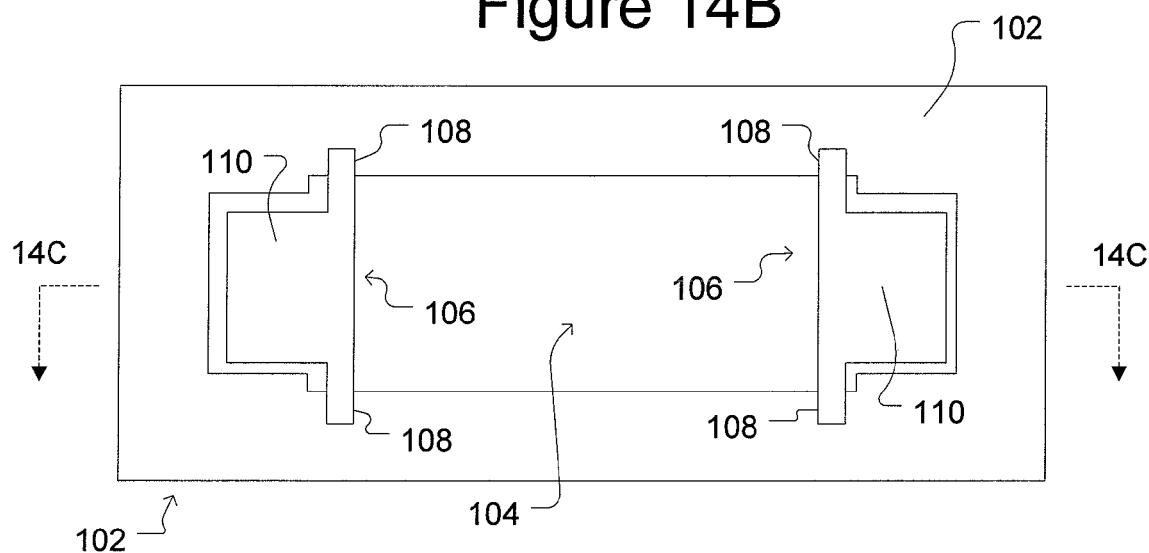

As shown in FIGS. 14A-14C, after etching the second material layer 908, the etch mask 1204 can be removed, which can be accomplished using any of the techniques discussed above for removing etch mask 1002. Portions of the separating layer 906 not disposed between overlapping portions of the unetched portions of the first material layer 904 and the second material layer 908 can also be removed. The separating layer 906 can be removed by dissolving the separating layer 906 in a solvent that does not dissolve or does not appreciably dissolve the first material layer 904 or the second material layer 908. Alternatively, the separating layer 906 can be removed by applying a dissolving solvent only to the separating layer 906 without exposing the first material layer 904 or second material layer 908 to appreciable amounts of the solvent. As yet another alternative, the separating layer 906 can be removed using lasers (e.g., portions of the separating layer 906 that are to be removed can be ablated).

As shown in FIGS. 14A-14C, a structure comprising global spring structures 106 attached to a tile 102 made from the multi-layer substrate 902 of FIG. 9. As discussed above, the tile 102 was etched from the first material layer 904 of multi-layer substrate 902 (an example of 802 of FIG. 8), and the global spring structures 106 were etched from the second material layer (an example of 804 of FIG. 8).

Referring again to the process 800 of FIG. 8, probes can be provided at 806. FIGS. 15A-15C illustrate an exemplary process for providing probes 112 (at 806 of FIG. 8) according to some embodiments of the invention. As discussed above with respect to FIGS. 1-5, each probe 112 can comprise a beam 114 and tip 116, and the tip 116 can be attached to or be integral with the beam 114. As shown in FIGS. 15A-15C, the beam 114 of each probe 112 can be attached to a platform 110 of a global spring structure 106. As also shown, the beams 114 can be attached to the platform 110 such that the beams 114 extend in a cantilevered manner away from the platform 110. The probes 112 can be positioned such that the tips 116 are disposed in a pattern that corresponds to a pattern of target objects (not shown) that are to be contacted by the tips 116. For example, if the probes 112 are to be used to contact an electronic device (not shown), such as one or more semiconductor dies, the probes can be positioned such that the tips 116 are disposed in a pattern that corresponds to a pattern of input and/or output terminals (not shown) on the electronic device (not shown).

The beams 114 can be attached to the platforms 110 in any suitable manner including without limitation gluing the beams 114 to the platforms 110 or using any type of adhesive material to attach the beams 114 to the platforms 110. Other non-limiting examples of suitable ways of attaching the beams 114 to the platforms include soldering, brazing, ultrasonic bonding, etc. For example, a metal layer (not shown) can be deposited (e.g., by plasma deposition, chemical vapor deposition, physical vapor deposition, sputter deposition, electroless plating, electron beam deposition, thermal evaporation, flame spring coating, plasma spray coating, etc.) on platform 110 and the beams 114, which can comprise a metal, can be soldered or brazed to the metal layer on the platform 110.

The probes 114 can be made in any suitable manner. For example, without limitation, the probes 114 can be made using any of the techniques and processes disclosed in the following patent documents: U.S. Pat. Nos. 6,482,013, 6,520, 778, 6,255,126, 6,827,584, 6,640,432; U.S. Patent Application Publication Nos. 2003/0199179, 2001/0012739, and 2004/0016119; and U.S. patent application Ser. Nos. 09/539, 287 and 09/710,539.

The exemplary processes illustrated in FIGS. 9-15C are exemplary only and many variations are possible. For example, probes other than probes 112 comprising a beam 114 and tip 116 can be attached to the platforms 110 of the global spring structures 106. For example, any of the following types of probes can be attached to the platforms 110 in place of probes 112: pogo pin probes, bump probes, stud probes, stamped spring probes, needle probes, buckling beam probes, wire probes, etc. FIGS. 16-19 illustrate non-limiting examples of some of these probe types as well as other non-limiting examples of variations relating to probes 112.

The contact structure 100 illustrated in FIGS. 1-7 as well as the processes illustrated in FIG. 8 and FIGS. 9-15C are exemplary only and modifications are possible. For example, rather than relying on a separating layer 906 as a stop etch layer to control etching of the first material layer 904 and the second material layer 908 as described above, etching of the first material layer 904 and the second material layer 908 can alternatively be controlled by controlling the amount of etching material applied to the first material layer 904 and the second material layer 908, in which case the separating layer 906 need not be used. As yet another exemplary alternative, the first material layer 904 and the second material layer 908 can be patterned using techniques other than etching. For example, the first material layer 904 and the second material layer 908 can be patterned by cutting or machining those layers. As another example, the first material layer 904 and the second material layer 908 can be patterned using a laser (e.g., by ablation). Again, the separating layer 906 need not be used.

Figure 16:
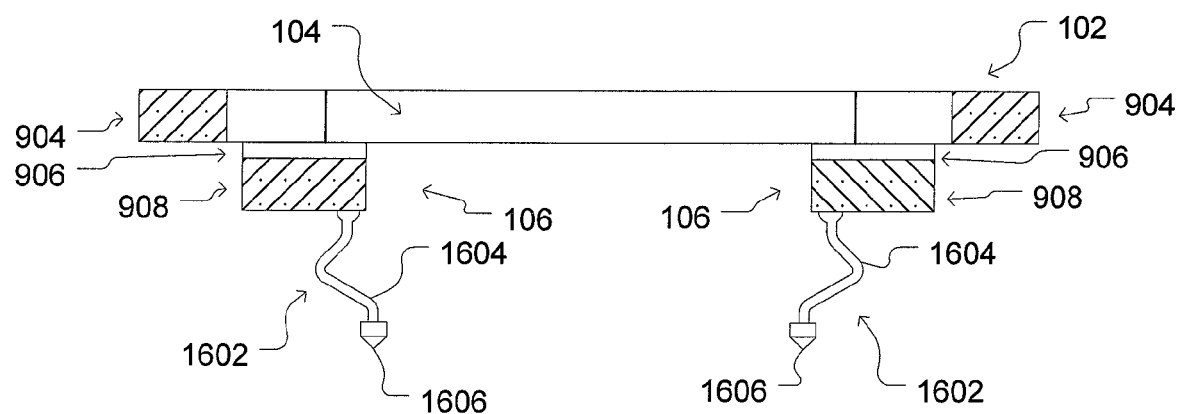
FIGS. 16-19 illustrate exemplary probes that can be used with the contact structure of FIG. 1 according to some embodiments of the invention.

FIG. 16 illustrates the same exemplary tile 102 and global spring structures 106 as are shown in FIGS. 1-15C. (As discussed above, the tile 102 can be etched or otherwise formed from the first material layer 904, and the global spring structure can be etched or otherwise formed from the separating layer 906 and the second material layer 908.) In FIG. 16, however, probes 1602—rather than or in addition to probes 112—are attached to the global spring structures 106. As shown in FIG. 16, probes 1602 can comprise a wire 1604 bonded to a global spring structure 106 and a contact tip 1606 attached to the wire 1604. The wire 1604 can be bonded to a global spring structure 106 using any suitable method, including without limitation ball bonding and wedge bonding methods. U.S. Pat. Nos. 5,476,211, 5,917,707, and 6,336,269 disclose exemplary processes and materials that can be used to make probes (like probes 1602) using wires (like wires 1604), and any of those processes and materials can be used to make probes 1602. For example, as discussed in the foregoing patents, the wires 1604 can be overcoated with a material that is harder, has a greater yield strength, or is more resilient than the material of the wire 1604. The tips 1606, which can be optional, can be formed separately using any suitable method and then attached to ends of the wires 1604. In FIGS. 8A-8C, U.S. Pat. No. 5,974,662 discloses exemplary methods and materials for making tips (like tips 1606) on a sacrificial or removeable substrate and then attaching the tips to probe structures (like wires 1604).

Figure 17:
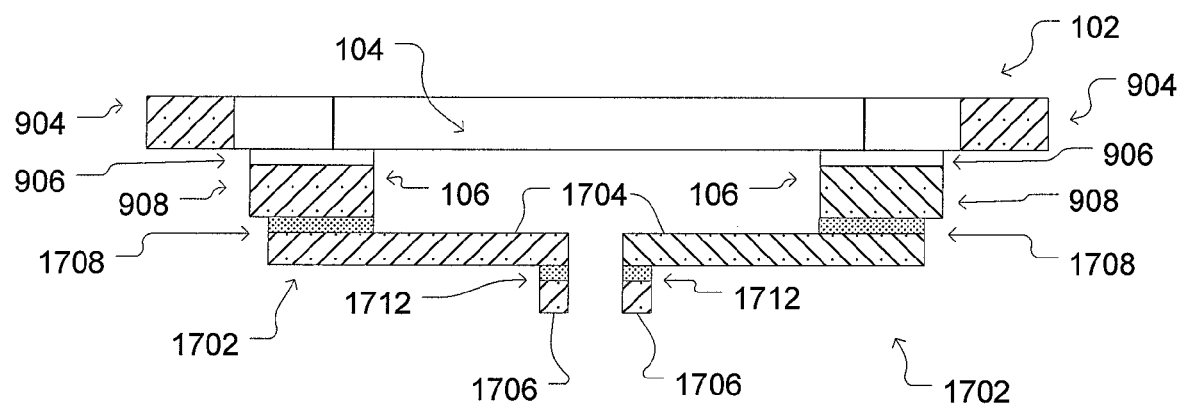

In the variation shown in FIG. 17, probes 1702—which can replace probes 112 or be included in addition to probes 112—can be formed on the global spring structures 106 using lithographic techniques, such as the techniques disclosed in U.S. Pat. No. 6,640,432. For example, the beams 1704 of probes 1702 can be formed in a layer of masking material (e.g., photoresist) (not shown) patterned in a desired shape of the beam 1704. The beam material can, for example, be electroplated onto a conductive seed layer 1708. (See, e.g., FIGS. 7-9 of U.S. Pat. No. 6,640,432.) Tips 1706 can similarly be formed in another layer of masking material (not shown) patterned in a desired shape of the tip 1706, and the tip material can likewise be electroplated onto a conductive seed layer 1712. (See, e.g., FIGS. 13a and 13b of U.S. Pat. No. 6,640,432.) The probes 1702 shown in FIG. 17 can be formed on second material layer 1908 prior to forming the global spring structures 106 from the second material layer 1908. Alternatively, a temporary fill material (not shown) can be deposited between global spring structures 106, and the probes 1702 can then be formed on the global spring structures 106 and the temporary fill material (not shown), after which the temporary fill material (not shown) can be removed.

Figure 18:
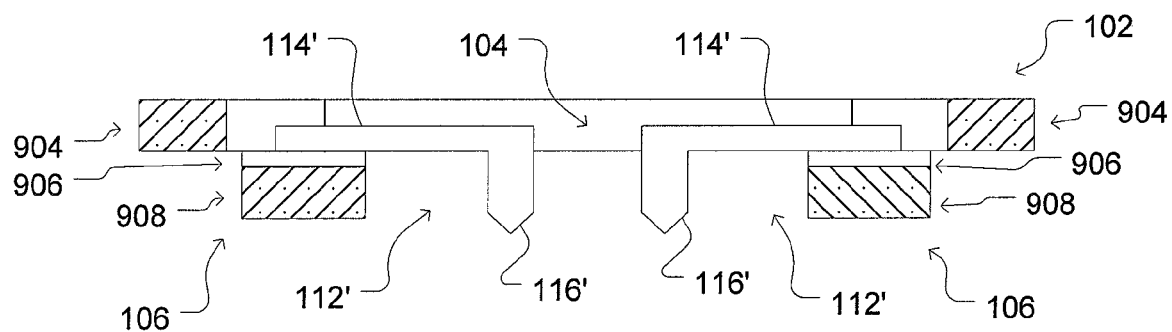

FIG. 18 shows another variation of the contact structure 100 of FIGS. 1-7 and 9-15C in which the beams 114' of the probes 112' are attached to an upper portion—rather than a lower portion as shown in FIGS. 1-15C—of the global spring structures 106. The tips 116' of the probes 112' in FIG. 18 can be longer than the tips 116 of the probes 112 shown in FIGS. 1-15C. As discussed above, the separating layer 906 need not be included in some embodiments, and in such embodiments, the probes 112' can be attached directly to the second material layer 908 that forms the global spring structure 106.

Figure 19:
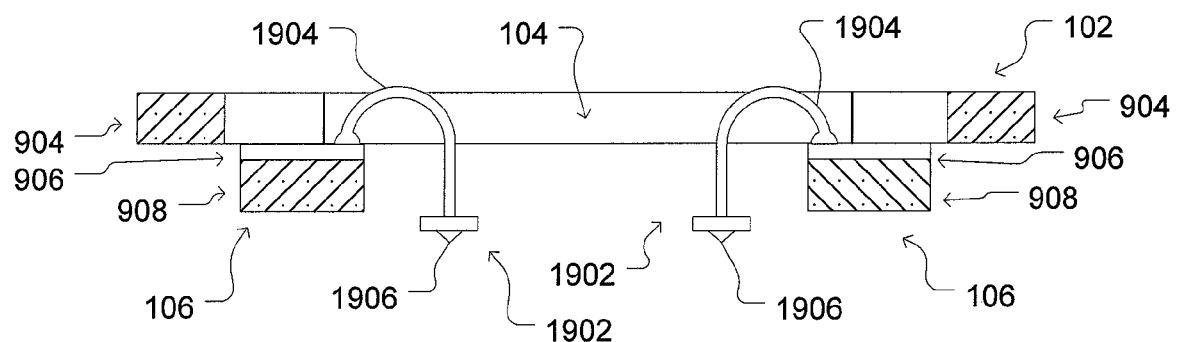

In FIG. 19, probes 1902—rather than or in addition to probes 112—can be attached to the global spring structures 106. As shown, the probes 1902 can comprise wires 1904 bonded (e.g., using ball and/or edge bonding techniques) to global spring structures 106 and tips 1906 attached to ends of the wires 1904. As discussed above, exemplary techniques for forming probes (like probes 1902) using wires (like wires 1904) are disclosed in U.S. Pat. Nos. 5,476,211, 5,917,707, and 6,336,269. For example, probes 1902 can be like the exemplary probes shown in FIGS. 11, 12, 14, and 15 of U.S. Pat. No. 5,917,707. Tips 1906 can be formed on a sacrificial or removable substrate (not shown in FIG. 19), and wires 1904 can be bonded to one of the global spring structures and one of the tips 1906, after which the tips 1906 can be released from the sacrificial or removable substrate (not shown in FIG. 19). FIGS. 14 and 15 of U.S. Pat. No. 5,917,707 illustrate non-limiting examples of the formation of such probes. Alternatively, probes 1902 need not have tips 1904. FIGS. 11 and 12 of U.S. Pat. No. 5,917,707 illustrate non-limiting examples of the formation of such probes without tips like tips 1906. As discussed above, the separating layer 906 need not be included in some embodiments, and in such embodiments, the probes 1902 can be attached directly to the second material layer 908 that forms the global spring structure 106.

In addition to variations in the beams 112, many variations of the global spring structures 106 shown in FIGS. 1-7 and made in accordance with the exemplary processes illustrated in FIGS. 9-15C are also possible. FIGS. 20A-21B illustrate non-limiting examples of such variations.

Figure 20A:
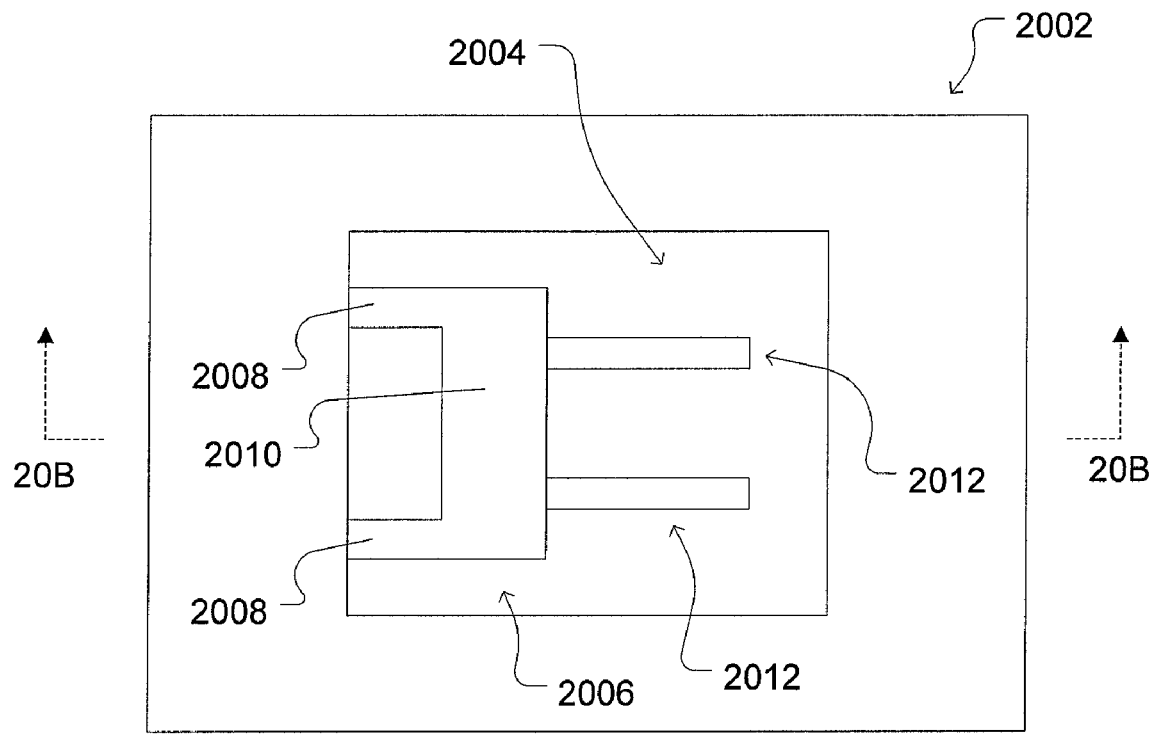
FIGS. 20A-21B illustrate exemplary global spring structures that can be used with the contact structure of FIG. 1 according to some embodiments of the invention.
Figure 20B:
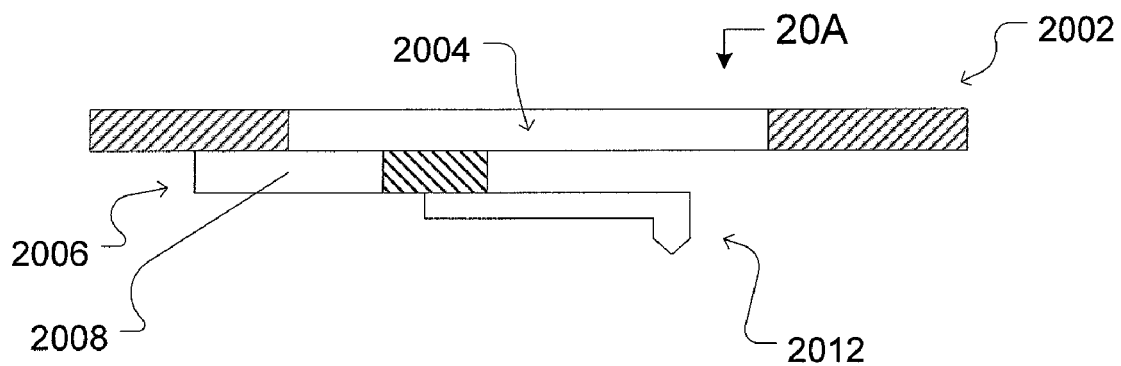

FIGS. 20A and 20B illustrate a tile 2002 with an opening 2004. As shown, probes 2012 are attached to a platform 2010 of a global spring structure 2006, which is attached by extension arms 2008 to the tile 2002. The tile 2002, opening 2004, and probes 2012 can be generally similar to and can be made like the tile, 102, opening 104, and probes 112 of FIGS. 1-7 and 9-15C. The global spring structure 2006 can be generally similar to the global spring structures 106 shown in FIGS. 1-7 and 9-15C except that extension arms 2008 are oriented differently than extension arms 108 of global spring structures 106. Otherwise, global spring structure 2006 can be generally similar to and made in a generally similar manner as global spring structure 106 of FIGS. 1-7 and 9-15C.

Figure 21A:
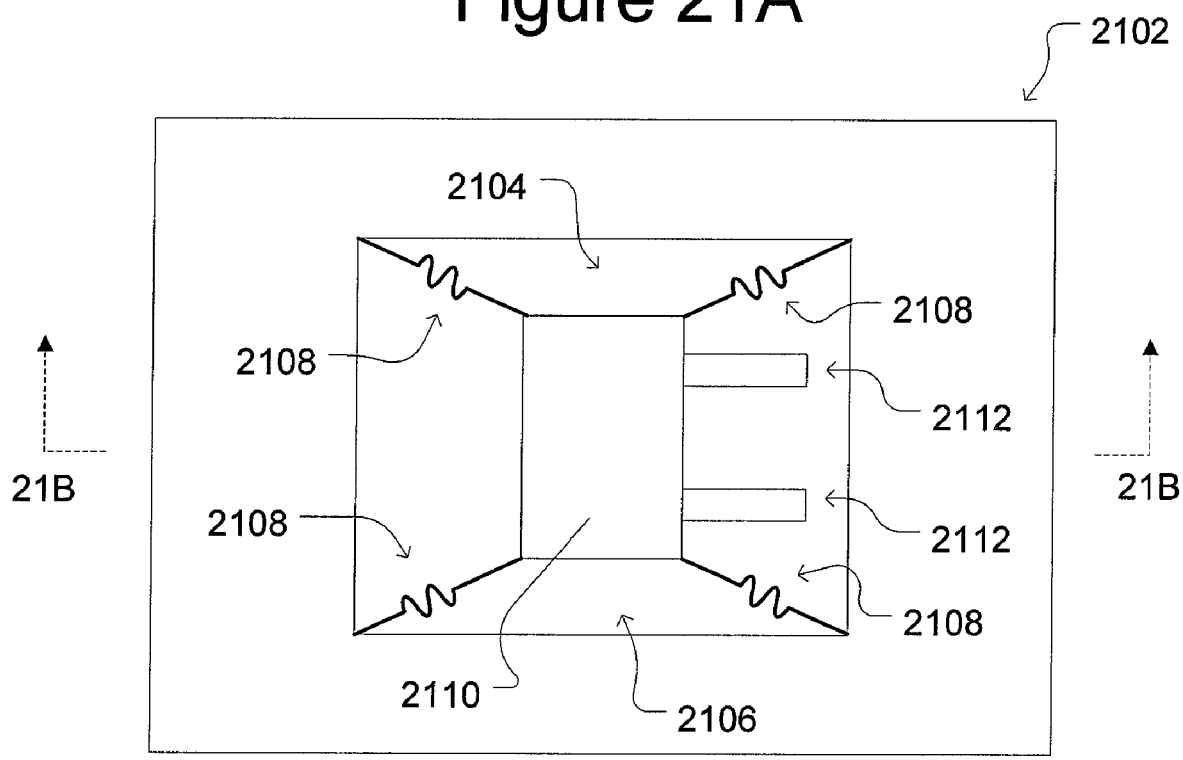
Figure 21B:
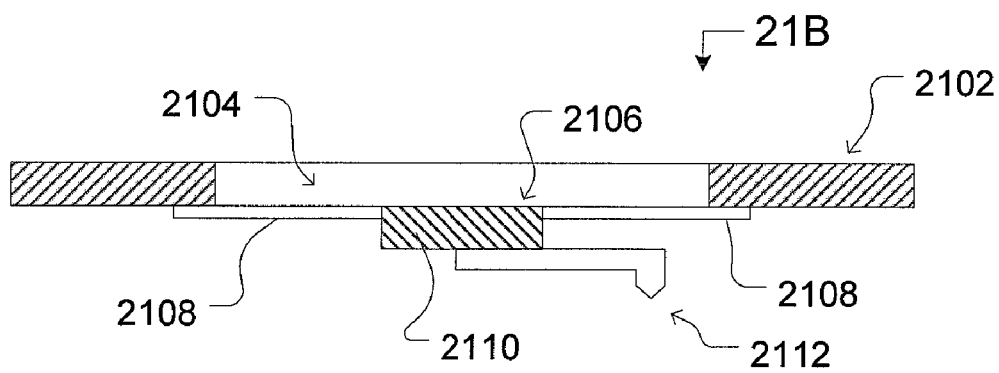

FIGS. 21A and 21B illustrate a tile 2102 with an opening 2104. Probes 2112 are attached to a platform 2110 of a global spring structure 2106, which is attached by extension arms 2108 to the tile 2102. The tile 2102, opening 2104, and probes 2112 can be generally similar to and can be made like the tile, 102, opening 104, and probes 112 of FIGS. 1-7 and 9-15C. As also shown in FIGS. 21A and 21B, the global spring structure 2106 can be suspended from a plurality of extension arms 2108 that can be attached to the tile 2102. As shown, the extension arms 2108 can include zig-zag shapes or other shapes that enhance the resilient, spring characteristics of the extension arms 2108. Otherwise, global spring structure 2106 can be generally similar to and made in a generally similar manner as global spring structure 106 of FIGS. 1-7 and 9-15C.

Other variations to the processes shown in FIGS. 9-15C include but are not limited to the following. The tile 102 and the global spring structures 106 need not be etched from the first material layer 904 and the second material layer 908. For example, the tile 102 can be cut from the first material layer 904 using a cutting tool (not shown), such as a knife, a scribing tool, a laser, etc. A laser can be used, for example, to remove material from the first material layer 904 by ablating the material. Global spring structures 106 can likewise be cut from the second material layer 908. In such a case, the separating layer 906 may be left out of substrate 902 and not used. As another example, the tile 102 and the global spring structures 106 need not be made from the same substrate 902. Rather, the tile 102 and the global spring structures 106 can be made separately, and the global spring structures 106 can then be attached to the tile 102. For example, the global spring structures 106 can be attached to the tile 102 using an adhesive material (e.g., glue) or by soldering, brazing, or any other suitable means of attaching.

Figure 22:
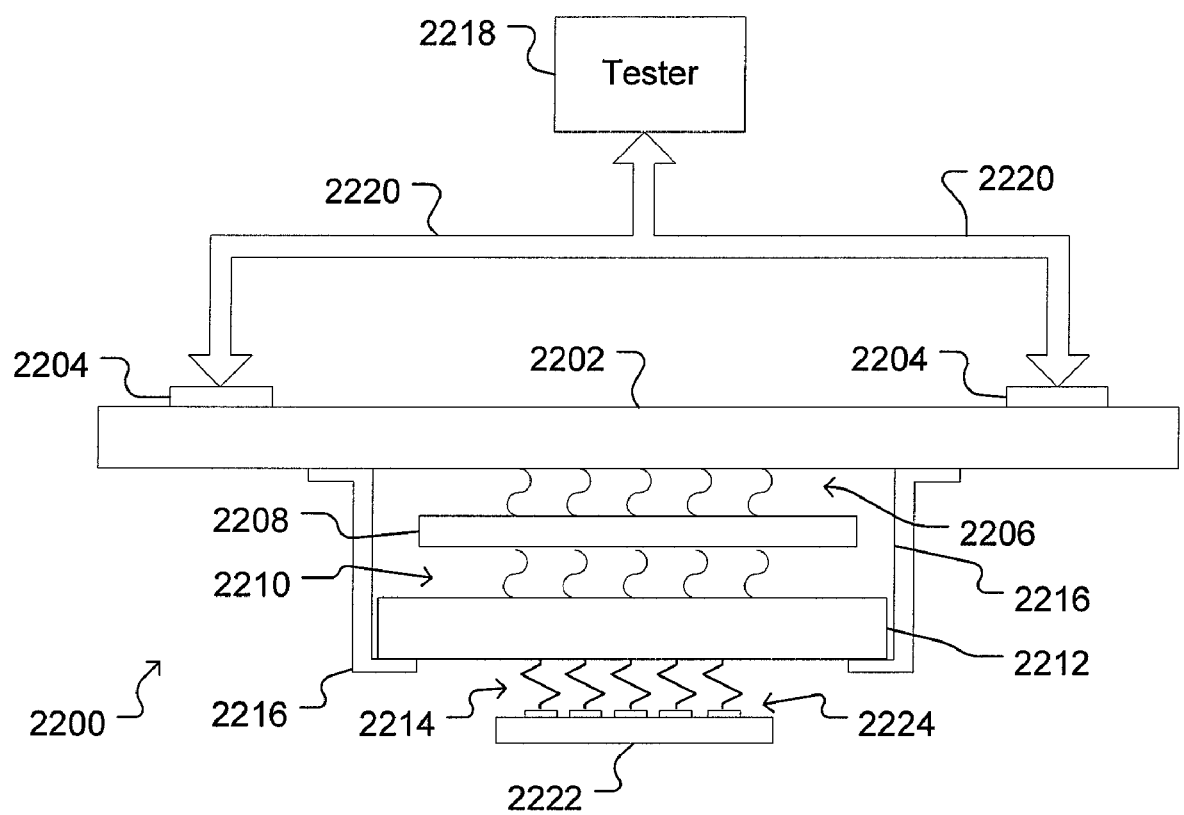
FIG. 22 shows an exemplary test system according to some embodiments of the invention.

As discussed above, there are many possible uses and applications for probing apparatuses, such as the contact structure 100 of FIGS. 1-7 and 9-15C and the contact structures shown in FIGS. 16-21B, and one such application is to test electronic devices. FIG. 22 shows an exemplary probe card assembly 2200, which can utilize a contact structure, such as 100 of FIGS. 1-7 and 9-15C or other contact structures shown in FIGS. 16-21B to test one or more electronic devices, according to some embodiments of the invention.

As shown in FIG. 22, the probe card assembly 2200 can comprise a wiring substrate 2202, an interposer substrate 2208, and a probe head 2212, which can be held together by brackets 2216 and/or other suitable means. The wiring substrate 2202 can include electrical connectors 2204 configured to make electrical connections with a plurality of communications channels 2220 to and from a tester 2218. Connectors 2204 can be pads for receiving pogo pins, zero-insertion-force connectors, or any other electrical connection device suitable for making electrical connections with communications channels 2220. Electrically conductive paths (not shown) can be provided through the probe card assembly 2200 to provide electrical connections from individual electrical connections in connectors 2204 (each such individual electrical connection can correspond to a communication channel 2220) to electrically conductive probes 2214, which can contact input and/or output terminals 2224 of an electronic device under test ("DUT") 2222. Those conductive paths (not shown) through the probe card assembly 2200 can comprise electrically conductive connections, such as traces and/or vias (not shown), from the connectors 2204 through the wiring substrate 2202 to electrically conductive spring interconnection elements 2206; electrically conductive connections, such as vias (not shown), through the interposer substrate 2208 electrically connecting the interconnection elements 2206 with electrically conductive spring interconnection elements 2210; and electrically conductive connections, such as traces and vias (not shown), through the probe head 2212 between the interconnection elements 2210 and the probes 2214. In this way, a plurality of signal paths comprising the communications channels 2220, the above-described conductive paths (not shown) through the probe card assembly 2200, and the probes 2214 are provided between the tester 2218 and the input and/or output terminals 2224 of the DUT 2222.

DUT 2222 can be any electronic device or devices to be tested, including without limitation one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, or any other type of electronic device or devices.

The configuration of probe card assembly 2200 shown in FIG. 22 is exemplary only and is simplified for ease of illustration and discussion. Many variations, modifications, and additions are possible. For example, although the probe card assembly 2200 is illustrated in FIG. 22 as having three substrates—the wiring substrate 2202, the interposer substrate 2208, and the probe head 2212—the probe card assembly 2200 can have more or fewer than three substrates. For example, probe head 2212 can be attached and electrically connected directly to the wiring substrate 2202. As another exemplary possible modification of the probe card assembly 2200, the probe card assembly 2200 can have more than one probe head 2212, and each such probe head 2212 can be independently adjustable. Non-limiting examples of probe card assemblies with multiple probe heads, like probe head 2212, are disclosed in U.S. patent application Ser. No. 11/165,833, filed Jun. 24, 2005. Additional non-limiting examples of probe card assemblies are illustrated in U.S. Pat. No. 5,974,622 and U.S. Pat. No. 6,509,751 and the aforementioned U.S. patent application Ser. No. 11/165,833, filed Jun. 24, 2005, and various features of the probe card assemblies described in those patents and application can be implemented in the probe card assembly 2200 show in FIG. 22.

DUT 2222 can be tested as follows. The tester 2218 can generate test signals, which can be provided through the communications channels 2220 and probe card assembly 2200 and probes 2214 to input terminals 2224 of the DUT 2222. Response signals generated by the DUT 2222 can be sensed by probes 2214 in contact with output terminals 2224 of the DUT and provided through the probe card assembly 2200 and communications channels 2220 to the tester 2218. The tester 2218 can analyze the response signals to determine whether the DUT 2222 responded properly to the test signals and, consequently, whether the DUT 2222 passes or fails the testing. The tester 2218 can alternatively or in addition rate the performance of the DUT 2222.

Figure 23:
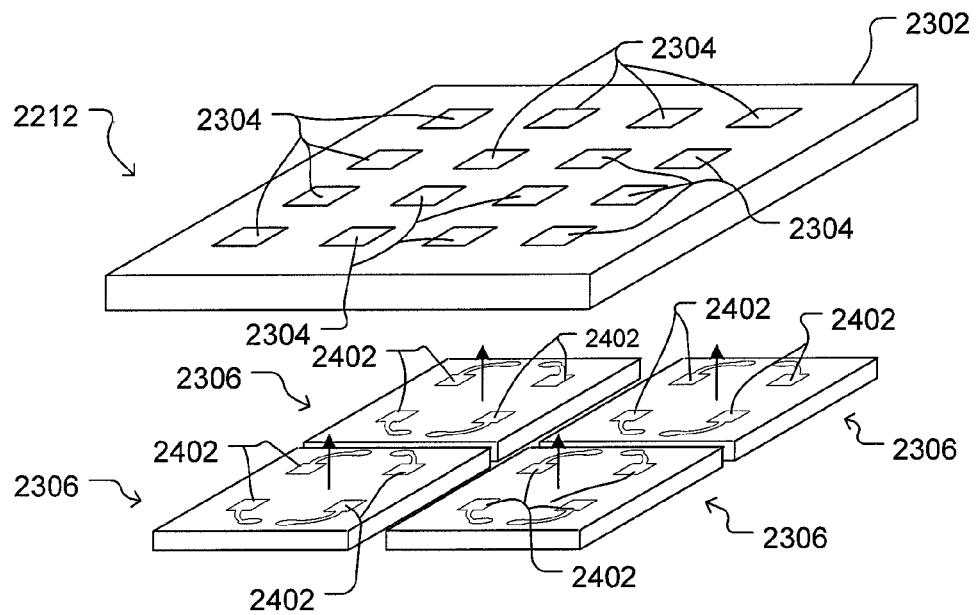
FIGS. 23 and 24 illustrate an exemplary probe head that can be used with the test system of FIG. 22 according to some embodiments of the invention.
Figure 24:
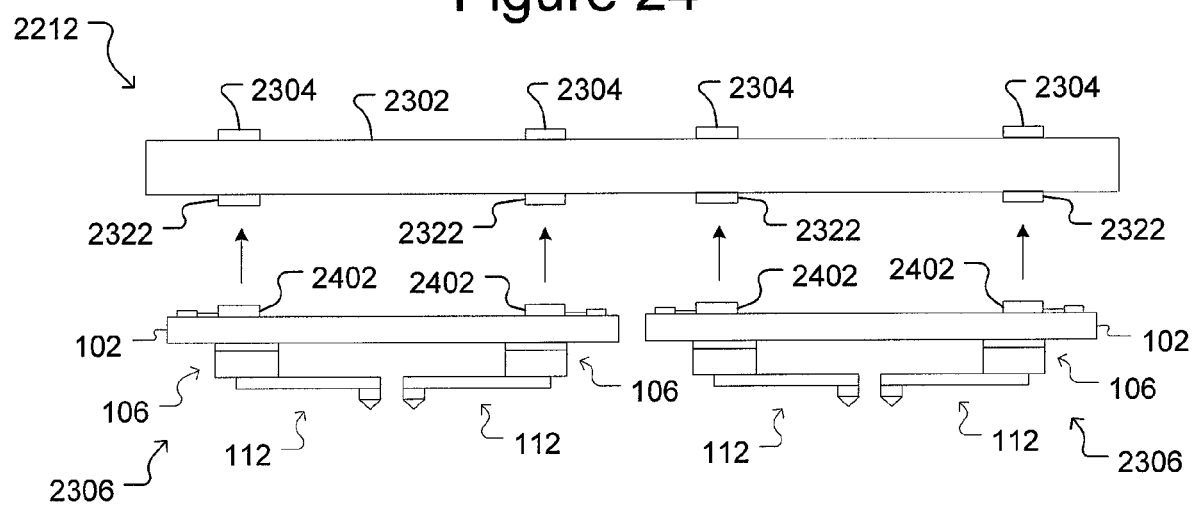

FIGS. 23 and 24 illustrate an exemplary configuration of the probe head 2212 according to some embodiments of the invention. As shown in FIGS. 23 and 24 (FIG. 23 shows a perspective, exploded view and FIG. 24 shows a side, exploded view of probe head 2212), the probe head 2212 can comprise a master substrate 2302 and a plurality of contact structures 2306. The master substrate 2302 can include electrically conductive terminals 2304 configured to make electrical connections with spring connections 2210 from interposer 2208 (see FIG. 22). Master substrate 2302 can also include a plurality of terminals 2322 similar to terminals 2304 but disposed on an opposite side of master substrate 2302. Electrically conductive vias (not shown) through the master substrate 2302 can electrically connect the terminals 2304 with the terminals 2322.

As also shown, each contact structure 2306 can be like the contact structure 100 of FIGS. 1-15C or any variation thereof, including but not limited to the exemplary variations shown in FIGS. 16-21B. For example, each contact structure 2306 can comprise a tile 102 and global spring structures 106 and probes 112 like the contact structure 100 described above. As shown in FIGS. 23 and 24, the contact structures 2306 can also include electrically conductive terminals 2402. As mentioned above, the contact structures 2306 can be attached to the master substrate 2302, and terminals 2402 can be electrically connected to terminals 2322 of the master substrate 2302. Although four contact structures 2306 are shown in FIGS. 23 and 24, more or fewer contact structures 2306 can be attached to a master substrate 2302 to make probe head 2212. Moreover, probe head 2212 can comprise more than one master substrate 2302 to which a plurality of contact structures 2306 are attached.

Figure 25A:
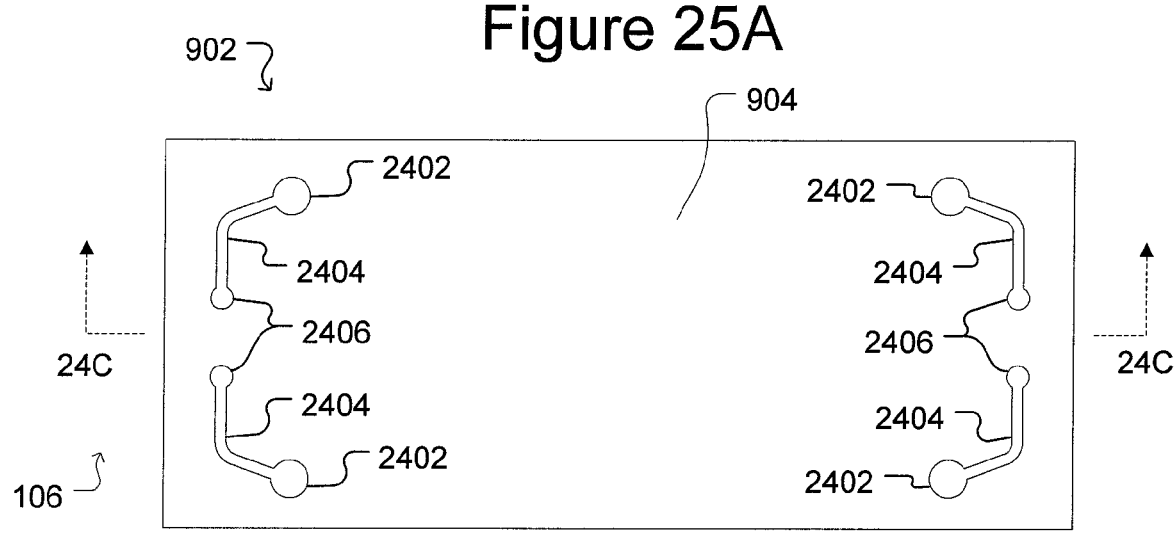
FIGS. 25A-27B illustrate an exemplary process for making the probe head of FIGS. 23 and 24 according to some embodiments of the invention.

FIGS. 25A-27B illustrate an exemplary method of making the probe head 2212 of FIGS. 23 and 24 according to some embodiments of the invention. As shown in FIGS. 25A-25C (which show top, bottom, and cross-sectional side views, respectively), a process of making the probe head 2212 of FIGS. 23 and 24 can begin with the multi-layered substrate 902 of FIG. 9, which as described above with respect to FIG. 9, can comprise a first material layer 904, a separating layer 906, and a second material layer 908.

Figure 25B:
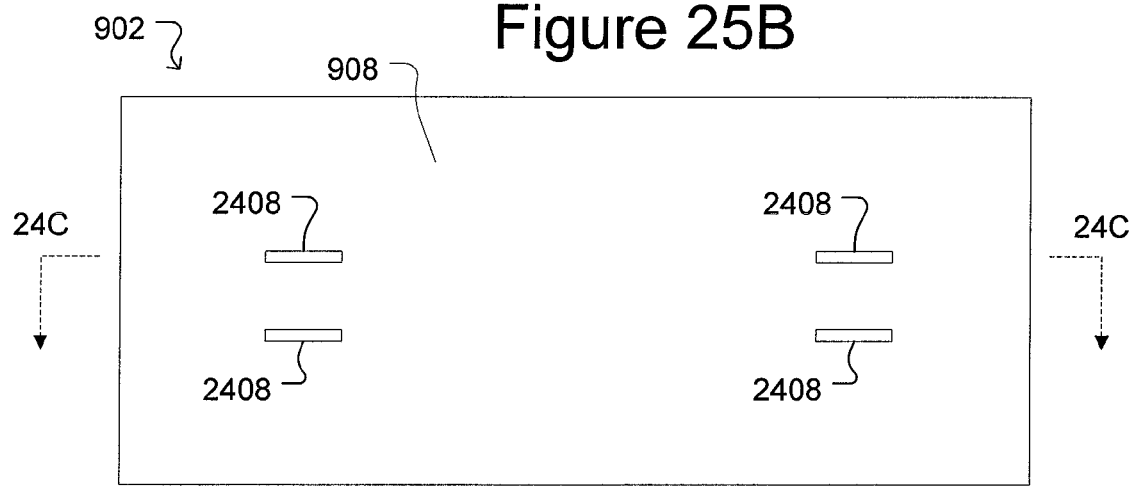
Figure 25C:
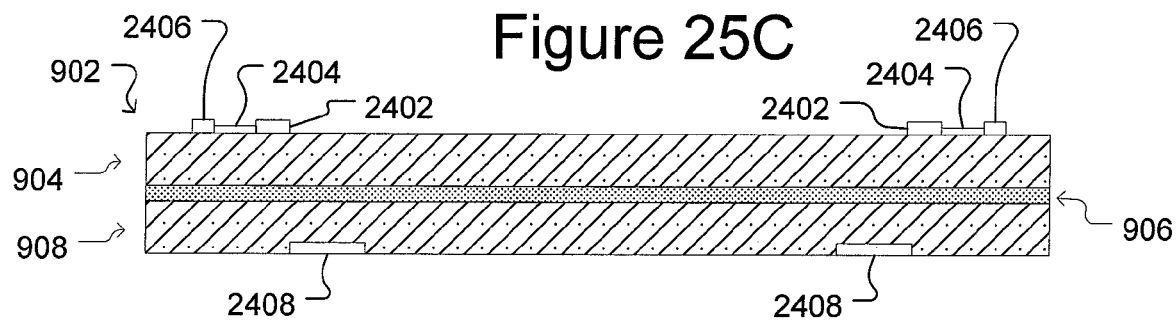

As also shown in FIGS. 25A and 25C, terminals 2402 can be formed on or attached to the first material layer 904 of the substrate 902. Electrically conductive pads 2406 and traces 2404 can also be formed on or attached to the first material layer 904 of the substrate 902, and the traces 2404 can electrically connect ones of the terminals 2402 with ones of the pads 2406 as generally shown in FIGS. 25A and 25C. Although four terminals 2402, four pads 2406, and four traces 2404 are shown, more or fewer can be used. As discussed above, the terminals 2404 can be electrically connected to the terminals 2322 of the master substrate 2302 (see FIGS. 23 and 24), and as will be seen, the pads 2406 can be used to make electrical connections with probes 112 (see FIGS. 27A and 27B). The terminals 2402 can thus be positioned on the first material layer 904 in a pattern that corresponds to a pattern of ones of the terminals 2322 on the master substrate 2303 (see FIGS. 23 and 24), and the pads 2406 can be positioned in any pattern that is convenient for making connections to the probes 112 (see FIGS. 27A and 27B). The terminals 2402, pads 2406, and traces 2404 can be formed in any suitable manner including, without limitation, by depositing one or more layers of a conductive material on the first material layer 904 of the substrate 902 using methods known to those skilled in the field.

As shown in FIGS. 25B and 25C, pits 2408 can be formed in the second material layer 908 of the substrate 902. As will be seen, the pits 2408 can be filled with solder and can be used to solder probes 112 to the global spring structures 106 that will be formed from the second material layer 908. (See FIGS. 27A and 27B.) The pits 2408 can thus be formed in a pattern that corresponds to a desired layout of the probes 112. The pits 2408 can be formed in any suitable manner including etching, cutting, etc. into the second material layer 908. Moreover, the pits 2408 can be coated with a metallic material or materials (not shown). For example, the metallic material or materials can be deposited onto surfaces of the pits 2408 using any suitable method including without limitation by plasma deposition, chemical vapor deposition, physical vapor deposition, sputter deposition, electroless plating, electron beam deposition, thermal evaporation, flame spring coating, plasma spray coating, etc.

Figure 26A:
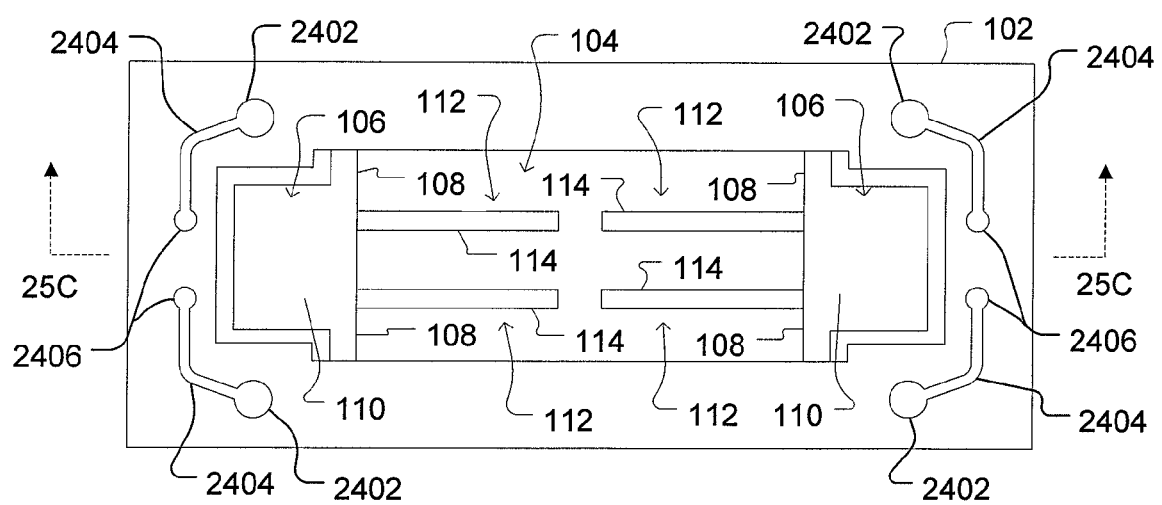
Figure 26B:
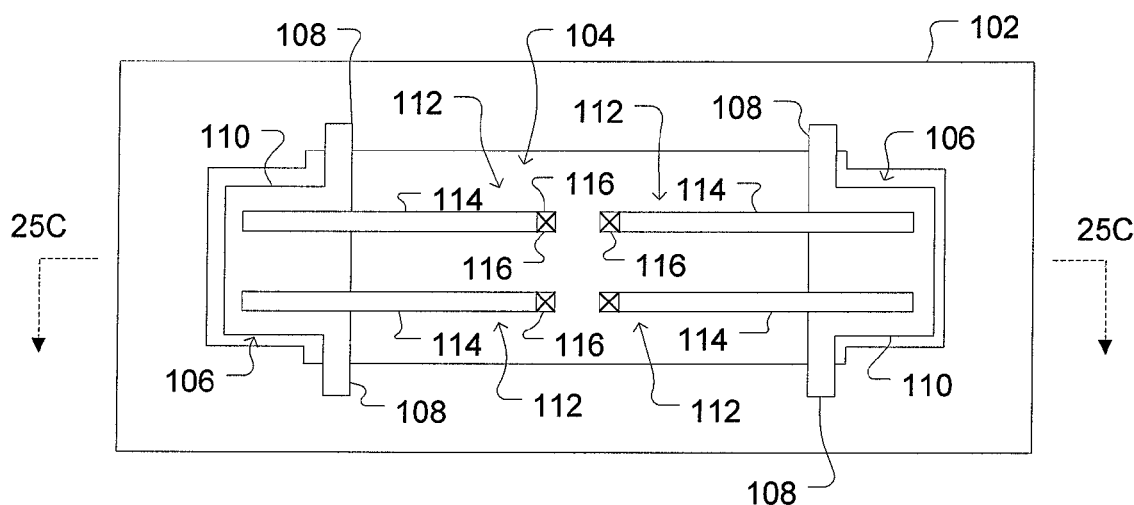
Figure 26C:
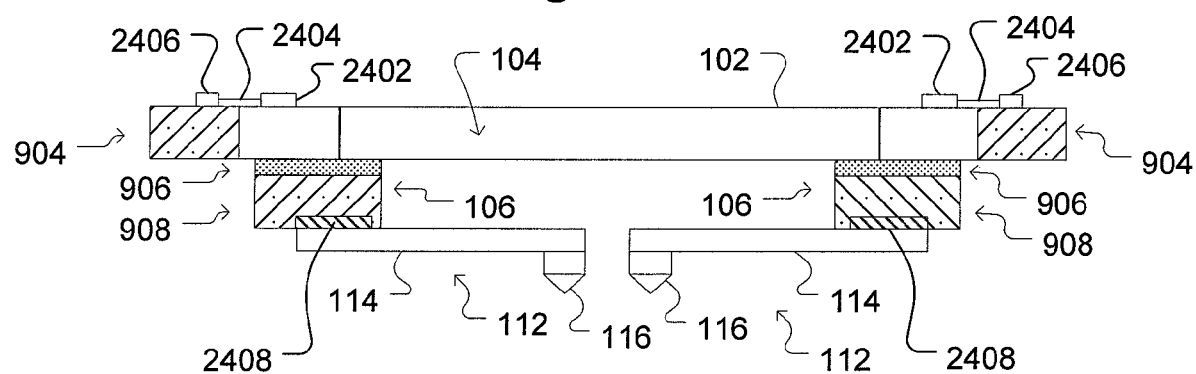

As shown in FIGS. 26A-26C (FIG. 26A shows a top view, FIG. 26B shows a bottom view, and FIG. 26C shows a side, cross-sectional view, respectively), tile substrate 102 with opening 104 can be made from the first material layer 904 of the multilayer substrate 902, which can be accomplished as shown in FIGS. 10A-11B and discussed with respect to those Figures including variations and modifications thereto. As also shown in FIGS. 26A-26C, global spring structures 106 can be formed from the second material layer 908 and the separating layer 906, which can be accomplished as shown in FIGS. 12A-14C and discussed with respect to those Figures including variations and modifications thereto. Alternatively, the tile substrate 102 and/or the global spring structures 106 can be like the tile substrate 202, 2102 and/or the global spring structures 2006, 2106 illustrates in FIGS. 20A-21B.

As also shown in FIGS. 26A-26C, probes 112 can be attached to the global spring structures 106 using solder in solder pits 2408. Alternatively, probes 112 can be attached to the global spring structures 106 using any method discussed above with respect to FIGS. 15A-15C or any variation or modification thereto. As another alternative, probes 112 can alternatively be like probes 1602, 1702, or 1902 of FIGS. 16, 17, and 19. As yet another alternative, probes 112 can be attached to the global spring structures 106 as shown in FIG. 18.

Figure 27A:
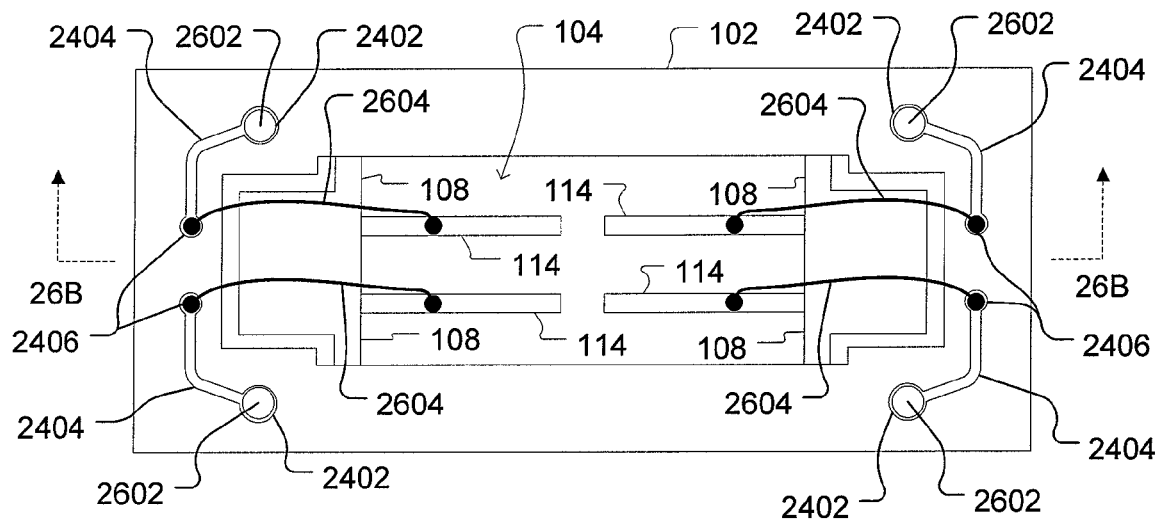
Figure 27B:
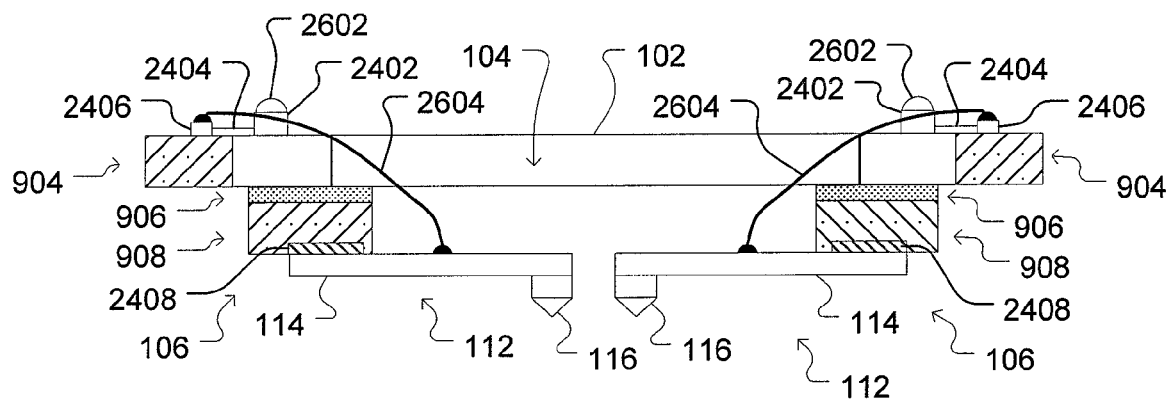

As shown in FIGS. 27A and 27B (FIG. 27A shows a top view and FIG. 27B shows a cross-sectional side view), ones of the probes 112 can be electrically connected to ones of the pads 2406. As also shown in FIGS. 27A and 27B, electrically conductive wires 2604 can be bonded at one end to a pad 2406 and at another end to a probe 112. Wires 2604 can comprise any electrically conductive material and can be bonded to pads 2406 and probes 112 in any suitable manner, including without limitation ball bonds, wedge bonds, etc. Note that the opening 104 in the tile substrate 102 can provide convenient access from the pads 2406 to the beams 114 of the probes 112. Rather than wires 2604, other types of electrical connectors can be used to electrically connect pads 2406 to probes 112. For example, flex circuits, conductive ribbon structures, and other connectors can electrically connect pads 2406 to probes 112.

In addition, solder 2602 can be applied to the terminals 2402. The terminals 2402 of the contact structure 2306 can thus be soldered to ones of the terminals 2322 of the master substrate 2302 (see FIGS. 23 and 24), which can attach the contact structure 2306 to the master substrate 2302 and electrically connect ones of the terminals 2402 with ones of the terminals 2322. Probes 112 can comprise electrically conductive materials, and electrically conductive paths can thus be provided from probes 112 through wires 2604 to pads 2406, through traces 2404 to terminals 2402, and from terminals 2402 through the master substrate 2302 to terminals 2304, which in turn can be electrically connected through the probe card assembly of FIG. 22 (as discussed above with respect to FIG. 22) to ones of the communications channels 2220 to and from the tester 2218 (see FIG. 22). Probes 112 (which can replace probes 2214 in FIG. 22 for a probe head 2212 configured as shown in FIGS. 23 and 24 and made in accordance with the process shown in FIGS. 25A-27B) can thus be brought into contact with terminals 2224 of DUT 2222 (see FIG. 22). The DUT 2222 can then be tested by providing test data generated by the tester 2218 through communications channels 2220 and probe card assembly 2200 to the DUT 2222, and response data generated by the DUT 2222 in response to the test data can be provided to the tester 2218 through the probe card assembly 2200 and the communications channels 2220 as described above. The tester 2218 can then analyze the response data (e.g., compare the response data to expected response data) and determine whether the DUT passes or fails the testing as also described above.

Figure 28:
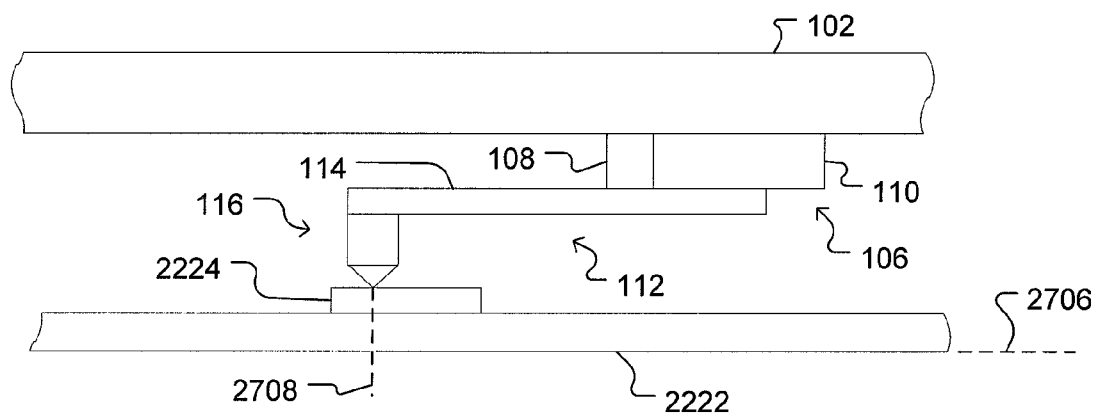
FIGS. 28 and 29 illustrate exemplary operation of a global spring structure and a probe of the probe head of FIGS. 23 and 24 according to some embodiments of the invention.
Figure 29:
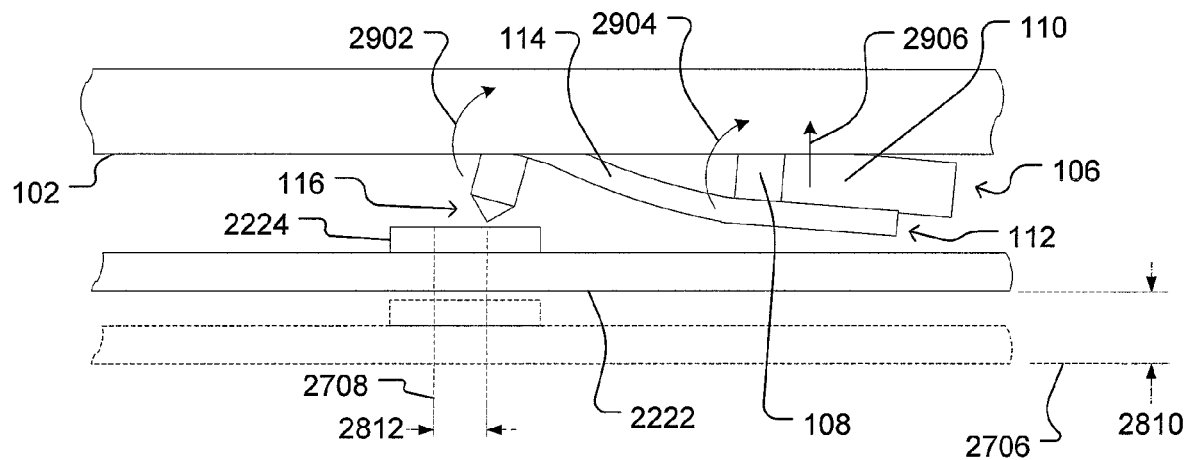

FIGS. 28 and 29 illustrate exemplary movement of a probe 112 in response to one of the terminals 2224 of DUT 2222 being pressed against the tip 116 of the probe 112. As shown in FIG. 28 and as discussed above, a terminal 2224 of DUT 2222 can be brought into initial contact with the tip 116 of a probe 112. The location 2706 of the DUT 2222 at first contact between the terminals 2224 and the probe tip 116 is identified as location 2706 in FIG. 28, and the location on the terminal 2224 where the probe tip 116 first contacts the terminal 2224 is identified as location 2708 in FIG. 28. As shown in FIG. 29, the DUT 2222 can be moved toward the probe 112 by a specified distance after the initial contact between the terminal 2224 and the probe tip 116 shown in FIG. 28. The distance by which the DUT 2222 is moved past initial contact with the tip 116 of the probe 112 can be referred to as "over travel" 2810 and is identified in FIG. 29 as 2810. Over travel 2810 can, among other things, help create a conductive electrical connection between the probe 112 and the terminal 2224 of the DUT 2222. As discussed above, the global spring structure 106 and the probe 112 can have spring properties. The global spring structure 106 and the probe 112 can thus generate counter forces that press the tip 116 of the probe 112 firmly against the terminal 2224.

The over travel 2810 of the DUT 2222 past initial contact with the tip 116 of the probe 112 can be absorbed by both the global spring structure 106 and the probe 112, both of which can be flexible or compliant. As generally discussed above, the extension arms 108 of the global spring structure 106 can allow the global spring structure to absorb some of the over travel. That is, as discussed above, in response to the force on the probe tip 116 from the terminal 2224 pressing against the tip 116, the extension arms 108 of the global spring structure 106 allow the platform 110 to both move upward 2906 and rotate 2904. As also discussed above, the beam 114 of the probe 112 can also rotate 2902 and thus also absorb some of the over travel 2810. The rotation 2902 of the beam 114 of the probe 112 and, typically to a lesser extent, the rotation 2904 of the global spring structure 106 can cause the tip 116 of the probe 112 to wipe 2812 across the terminal 2224. This wiping action can be advantageous because the wiping action can aide the tip 116 in cutting through oxide or debris that can build up on the terminal 2224. The upward translational movement 2906 of the global spring structure 106 does not typically cause an appreciable amount of wiping action 2812, and as mentioned, the rotation 2902 of the beam 114 typically contributes more to the wiping action 2812 than the rotation 2904 of the global spring structure 106. Thus, the length of the wiping action across the terminal 2224 need not be dependent on the distance of over travel 2810 of the DUT 2222 past initial contact with the tip 116 of the probe 112 but can be tailored. That is, by varying the spring constants and other parameters of the probe 112 and the global spring structure 106 longer or shorter wiping 2812 of the probe tip 116 across the DUT terminal 2224 can be designed into a particular contact structure 2306 and thus into a probe card assembly 2200 for the same length of over travel 2810.

Figure 30:
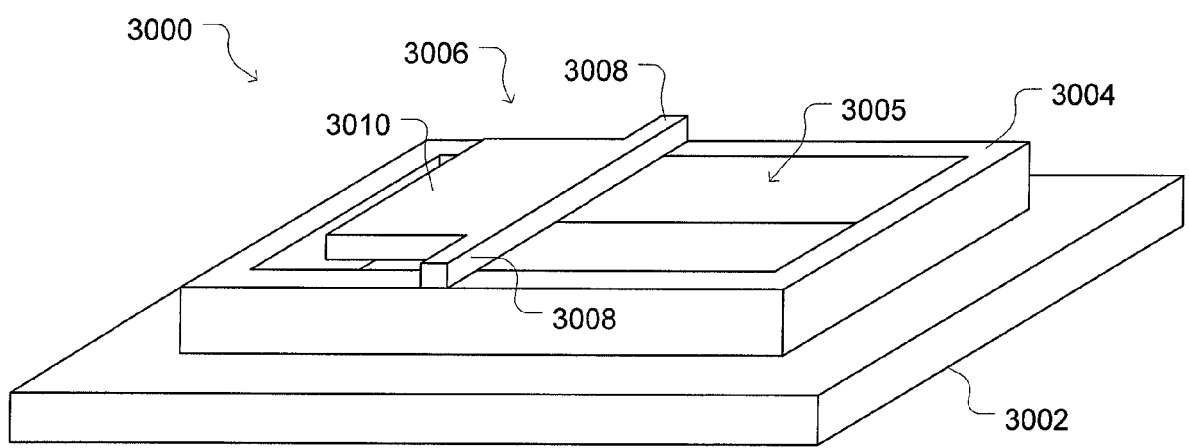
FIG. 30 illustrates an exemplary contact structure according to some embodiments of the invention.

Although specific embodiments and applications of the invention have been described in this specification, there is no intention that the invention be limited to these exemplary embodiments and applications or to the manner in which the exemplary embodiments and applications operate or are described herein. For example, although many of the processes illustrated and described above utilize a substractive method to form a contactor structure (e.g., like contactor structure 100 shown in FIGS. 1-7 and 15A-15C), additive processes can alternatively be used to make such contact structures. (FIGS. 9-15C illustrate an exemplary substractive process in which portions of the first material layer 904, separating layer 906, and second material layer 908 are removed (or substracted) from the multi-layered substrate 902 to form the contact structure 100.) FIG. 30 illustrates an example of a contact structure 3000 that can be made using an additive process according to some embodiments of the invention.

As shown in FIG. 30, contact structure 3000 can include a substrate 3002 on which can be disposed a frame 3004 with a opening 3005. The contact structure 3000 can also include a global spring structure 3006 having a platform 3010 disposed over the opening 3005 and extension arms 3008 attached to the frame 3004. Although not shown in FIG. 30, probes (e.g., like probes 112, 1602, 1702, 112', 1902, etc.) can be attached to or formed on the platform 3010 in the same way that any of probes 112, 1602, 1702, 112', or 1902 is attached to or formed on the platform 110 of global spring structure 106 as discussed above.

The frame 3004 can be and function generally like the substrate 102 of FIGS. 1-15C, and the global spring structure 3006 can be and function generally like the global spring structure 106. For example, the extension arms 3008 of the global spring structure 3006 can translate and rotate with respect to the frame 3004 in the same way that the global spring structure 106 translates and rotates with respect to the substrate 102 (see, e.g., FIGS. 6 and 7). The opening 3005 provided by the frame 3004 can allow for such translational and rotational movements in the same way that the opening 104 in substrate 102 allows for such translational and rotational movements (see, e.g., FIGS. 6 and 7).

As mentioned above, the contact structure 3000 can be made using an additive process. For example, a process of making the contact structure 300 can begin with the substrate 3002, which can be, for example, a blank semiconductor substrate, a ceramic substrate, or a substrate made of any suitable material. A first patternable material (e.g., photo resist) (not shown) can be deposited on the substrate 3002 and patterned to have openings (not shown) to the substrate 3002 in the shape of the frame 3004, which can then be formed by depositing a first material or materials into the openings (not shown) in the first patternable material (not shown) on the substrate 3002. The first patternable material (not shown) and the material or material deposited into the openings (not shown) that forms the frame 3004 can be planarized (e.g., by lapping or grinding).

A second patternable material (not shown) can be deposited over the planarized surface of the first patternable material (not shown) and frame 3004, and the second patternable material (not shown) can be patterned to have openings (not shown) to the planarized surface of the first patternable material (not shown) and frame 3004 in the shape of the global spring structure 3006. The global spring structure 3006 can then be formed by depositing a second material or materials into the openings (not shown) in the second patternable material (not shown). The second patternable material (not shown) and the material or material deposited into the openings (not shown) that form the global spring structure 3006 can be planarized (e.g., by lapping or grinding). The first patternable material (not shown) and the second patternable material (not shown) can then be removed, leaving the contact structure 3000 shown in FIG. 30. Probes (e.g., like probes 112, 1602, 1702, 112', 1902, etc.) can be attached to or formed on the platform 3010 in the same way that any of probes 112, 1602, 1702, 112', or 1902 are attached to or formed on the platforms 110 of global spring structure 106 as discussed above. Of course, multiple global spring structures 3006 can be formed on the frame 3004, and multiple frames 3004 can be formed on the substrate 3002.

What is claimed is:

1. A probing apparatus comprising:
    a substrate;
    a spring structure comprising a platform moveably attached to the substrate; and
    a plurality of resilient probes attached to a surface of the platform, each said probe comprising a beam portion that extends away from the platform in a direction that is generally parallel to the surface the platform, the probe further comprising a contact portion disposed on the beam portion to contact a device, the beam portion being bendable with respect to the platform,
    wherein:
        the platform moves in a same, uniform movement in response to forces on the contact portions of the probes, the movement of the platform providing a uniform first source of compliance equally to each of the probes in response to the forces on the contact portions of the probes, and
        each beam portion of each of the probes bends individually with respect to the platform in response to one of the forces on the contact portion of the probe, the bending of each of the beam portions providing second sources of individual compliance to each of the probes.

2. The probing apparatus of claim 1, wherein:
    the platform comprises extension arms movably connecting the platform to the substrate.

3. The probing apparatus of claim 1, wherein:
    the forces arise from contact between terminals of the device and the probes,
    the first source of compliance comprises compliance in a first direction corresponding to a direction of the forces on the probes, and
    the second sources of individual compliances each comprise compliance in a second direction, which corresponds to a scrubbing motion of the contact portions of the probes on the terminals of the device.

4. The probing apparatus of claim 3, wherein each of the second sources of compliance further comprises compliance in the first direction.

5. The probing apparatus of claim 1, wherein the substrate comprises a plurality of electrical contacts, and the probing apparatus further comprises a plurality of electrical connections electrically connecting ones of the electrical contacts with ones of the probes.

6. The probing apparatus of claim 1, wherein:
    the device comprises one or more semiconductor dies,
    the probes are electrically conductive and disposed to contact terminals of the one or more dies,
    the probing apparatus further comprises an electrical interface configured to receive test data for testing the one or more dies, and the probes are electrically connected to the interface.

7. The probing apparatus of claim 1, wherein:
    the substrate, spring structure, and probes compose a tile structure, and the probing apparatus comprises a plurality of such tile structures attached to a master substrate.

8. The probing apparatus of claim 1 further comprising a second spring structure attached to the substrate, and a second plurality of probes attached to the second spring structure.

9. The probing apparatus of claim 1, wherein the platform of the spring structure to which the probes are attached comprises a torsional spring component, and each of the beam portions of the probes comprises a cantilever spring component.

10. The probing apparatus of claim 1, wherein the movement of the platform of the spring structure to which the probes are attached provides the uniform first source of compliance equally to each of the probes in response to unequal forces on at least two of the contact portions of the probes.

11. The probing apparatus of claim 1, wherein the beam portions of each of the probes are substantially parallel and oriented in a same direction.

12. A method of making a probing apparatus comprising:
    obtaining a first substrate, a spring structure comprising a platform moveably attached to the first substrate, and a plurality of probes attached to a surface of the platform, wherein each of the probes comprises a beam portion extending away from the platform in a direction generally parallel to the surface of the platform;
    configuring the spring structure such that the platform of the spring structure to which the probes are attached moves in a same, uniform movement in response to forces on contact portions of the probes, the movement of the platform of the spring structure providing a uniform first source of compliance equally to each of the probes in response to the forces; and
    configuring the beam portions of each of the probes to bend individually with respect to the platform in response to one of the forces on the contact portion of the probe, the bending of each of the beam portions providing a second source of compliance individually to each probe in response to the forces.

13. The method of claim 12, wherein the configuring the spring structure comprises forming the spring structure from one or more layers of a multilayer substrate, wherein the first substrate comprises one or more other layers of the multilayer substrate.

14. The method of claim 13, wherein the forming the spring structure further comprises removing portions of the one or more layers of the multilayer substrate.

15. The method of claim 14, wherein the removing comprising removing portions of the one or more layers to form extension arms attached to the first substrate and extending to the platform.

16. The method of claim 15, wherein
    the contact portion of each of the probes comprises a contact tip disposed on the beam portion of the probe.

17. The method of claim 12 further comprising:
    forming a second spring structure from the one or more layers of the multilayer substrate; and
    disposing a second plurality of resilient probes on the second spring structure.

18. The method of claim 12 further comprising:
    providing a plurality of electrical contacts on the first substrate; and
    electrically connecting ones of the electrical contacts with ones of the probes.

19. The method of claim 12 further comprising:
    disposing the contact portions of the probes to contact terminals of one or more semiconductor dies to be tested,
    providing an electrical interface configured to receive test data for testing the one or more dies, and
    electrically connecting the probes to the interface.

20. The method of claim 12, wherein the first substrate, spring structure and probes compose a tile structure, the method further comprising:
    making a plurality of such tile structures; and
    attaching the tile structures to a master substrate.

21. The method of claim 12, wherein:

the forces on the contact portions of the probes arise from contact with terminals of an electronic device, the first source of compliance comprises compliance in a first direction corresponding to a direction of the forces on the probes, and the second sources of compliance each comprise compliance in a second direction, which corresponds to a scrubbing motion of the contact portions of the probes on the terminals of the electronic device.

22. The method of claim 21, wherein each of the second sources of compliance further comprises compliance in the first direction.

23. The method of claim 12, where:

the configuring the spring structure comprises configuring the platform to function as a torsional spring in response to the forces on the contact portions of the probes; and the configuring the beam portions comprises configuring the beam portions to function as cantilever springs in response to the forces.

24. The method of claim 12, wherein the movement of the platform of the spring structure to which the probes are attached provides the uniform first source of compliance equally to each of the probes in response to unequal forces on at least two of the contact portions of the probes.

25. The method of claim 12, wherein the beam portions of each of the probes are substantially parallel and oriented in a same direction.

* * * * *